US012538514B2

(12) United States Patent
Li

(10) Patent No.: US 12,538,514 B2
(45) Date of Patent: Jan. 27, 2026

(54) SEMICONDUCTOR APPARATUS AND METHOD FOR FABRICATING SAME

(71) Applicant: GUANGDONG ZHINENG TECHNOLOGIES, CO. LTD., Guangdong (CN)

(72) Inventor: Zilan Li, Guangdong (CN)

(73) Assignee: GUANGDONG ZHINENG TECHNOLOGIES, CO. LTD., Guangzhou (CN)

( * ) Notice: Subject to any disclaimer, the term of this patent is extended or adjusted under 35 U.S.C. 154(b) by 498 days.

(21) Appl. No.: 17/918,837

(22) PCT Filed: Feb. 8, 2021

(86) PCT No.: PCT/CN2021/075969
§ 371 (c)(1),
(2) Date: Oct. 13, 2022

(87) PCT Pub. No.: WO2021/208577
PCT Pub. Date: Oct. 21, 2021

(65) Prior Publication Data
US 2023/0139758 A1    May 4, 2023

(30) Foreign Application Priority Data

Apr. 13, 2020 (CN) .......................... 202010287927.3

(51) Int. Cl.
*H10D 30/47* (2025.01)
*H01L 21/78* (2006.01)
(Continued)

(52) U.S. Cl.
CPC ........... *H10D 30/477* (2025.01); *H01L 21/78* (2013.01); *H01L 21/7806* (2013.01);
(Continued)

(58) Field of Classification Search
CPC ......... H10D 30/015; H10D 30/47–485; H10D 64/252
See application file for complete search history.

(56) References Cited

U.S. PATENT DOCUMENTS 9,799,726 B1    10/2017   Khalil
2005/0067714 A1*  3/2005   Rumer .................... H01L 24/17
                                                        257/E23.19
(Continued)

FOREIGN PATENT DOCUMENTS

CN     103311289 A    9/2013
CN     106098664 A    11/2016
(Continued)

*Primary Examiner* — Wasiul Haider
(74) *Attorney, Agent, or Firm* — Seed Intellectual Property Law Group LLP

(57) ABSTRACT

The present disclosure relates to a semiconductor device and a manufacturing method thereof; wherein the semiconductor device comprises a semiconductor device layer including one or more semiconductor devices; a first electrode interconnection layer disposed on a first side of the semiconductor device layer; one or more first metal pillars disposed on the first side of the semiconductor device layer and electrically connected to the first electrode interconnection layer; a first insulating material disposed around the one or more first metal pillars, wherein the first insulating material is an injection molding material; and a second electrode interconnection layer disposed on a second side opposite to the first side of the semiconductor device layer. In the technical scheme of the present disclosure, the temporary substrate is not required to achieve better support strength and complete the related processes of the semiconductor manufacturing process, which is convenient, convenient and low in cost.

19 Claims, 31 Drawing Sheets

(51) Int. Cl.
*H10D 8/01* (2025.01)
*H10D 8/60* (2025.01)
*H10D 30/01* (2025.01)
*H10D 64/20* (2025.01)

(52) U.S. Cl.
CPC .............. *H10D 8/051* (2025.01); *H10D 8/60* (2025.01); *H10D 30/015* (2025.01); *H10D 30/4732* (2025.01); *H10D 64/20* (2025.01)

(56) References Cited

U.S. PATENT DOCUMENTS

2008/0164573 A1* 7/2008 Basker .................. H01L 21/486
                                                                    257/E23.09
2017/0222047 A1   8/2017 Conway et al.
2017/0338206 A1* 11/2017 Seo .................... H01L 23/53238
2020/0111763 A1*  4/2020 Hong ...................... H01L 24/08
2020/0312734 A1* 10/2020 Su ........................ H01L 23/367

FOREIGN PATENT DOCUMENTS

| CN | 106549038 A | 3/2017 |
| CN | 110224019 A | 9/2019 |
| CN | 110400776 A | 11/2019 |
| CN | 111816701 A | 10/2020 |
| CN | 111863956 A | 10/2020 |
| TW | 202013738 A | 4/2020 |

* cited by examiner

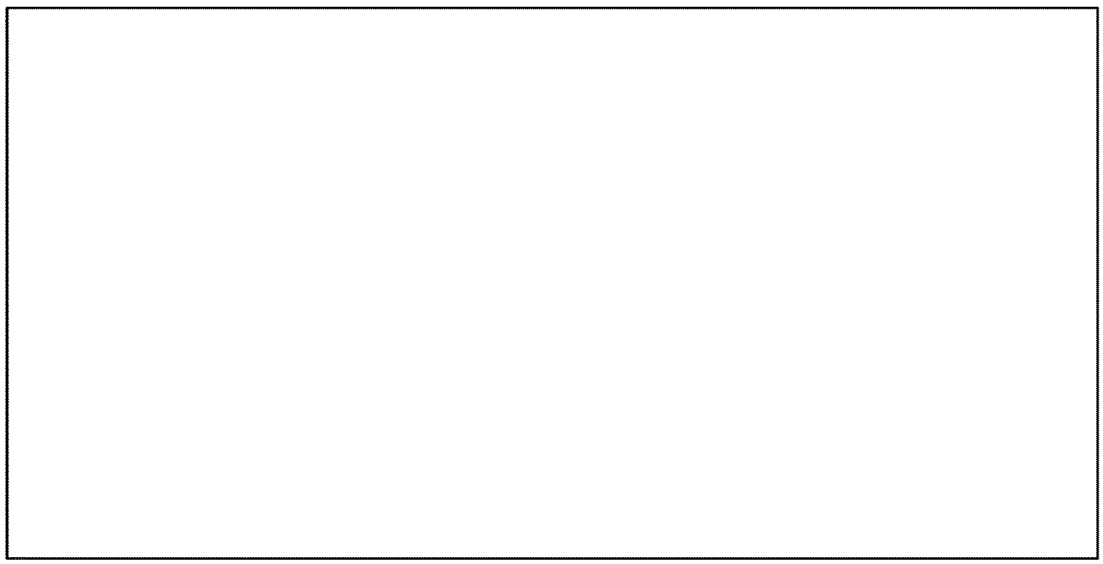
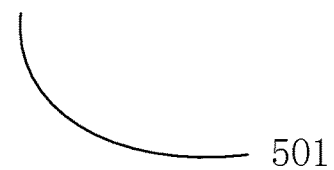
FIG. 5AA
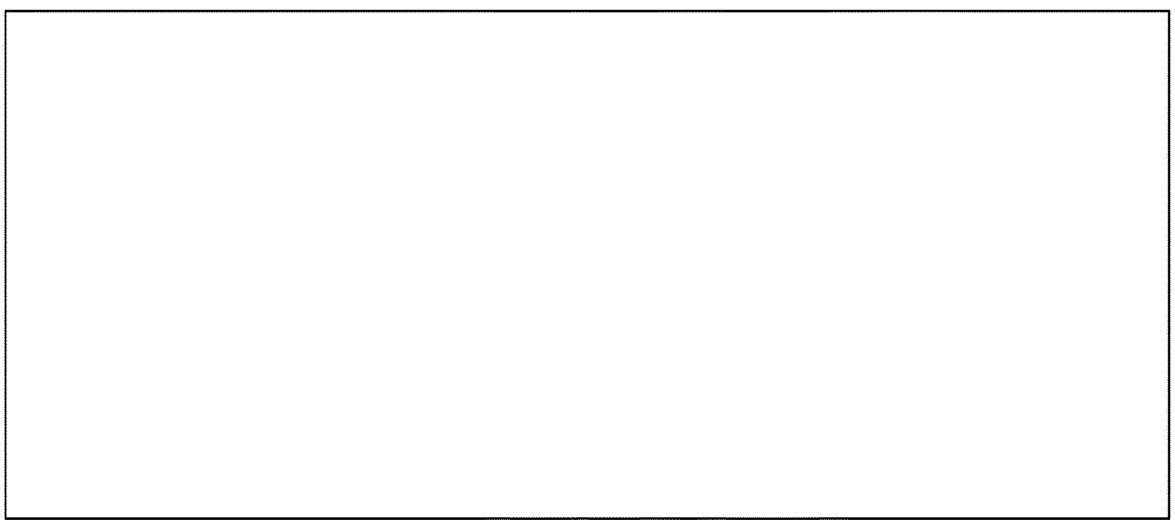
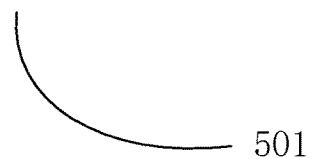
FIG. 5AB

SEMICONDUCTOR APPARATUS AND METHOD FOR FABRICATING SAME

FIELD OF THE INVENTION

The present disclosure relates to the field of semiconductor technology, in particular to a semiconductor device and a manufacturing method thereof.

BACKGROUND OF THE INVENTION

Group III nitride semiconductors are important semiconductor materials, mainly including AlN, GaN, InN and their compounds such as AlGaN, InGaN, AlInGaN, and the like. Due to the advantages of direct band gap, wide band gap and high breakdown electric field strength, group III nitride semiconductors represented by GaN have broad application prospects in the fields of light-emitting devices, power electronics, and radio frequency devices.

Different from conventional non-polar semiconductor materials such as Si, group III nitride semiconductors have polarity, that is, they are polar semiconductor materials. Polar semiconductors have many unique characteristics. It is particularly important that there are fixed polarization charges on the surface of the polar semiconductor or at the interface of two different polar semiconductors. The presence of these fixed polarization charges can attract movable electron or hole carriers to form two-dimensional electron gas 2 DEG or two-dimensional hole gas 2 DHG. The generation of these two-dimensional electron gas 2 DEG or two-dimensional hole gas 2 DHG does not require an additional electric field, nor does it depend on the doping effect in the semiconductor, and is generated spontaneously. The two-dimensional electron gas or the two-dimensional hole gas at the polar semiconductor interface may have a high surface charge density. At the same time, since doping is not required, the ion scattering and other effects of two-dimensional electron gas or two-dimensional hole gas are greatly reduced, so it has high mobility. The high surface charge density and mobility make the two-dimensional electrons or hole gas generated spontaneously at the interface have good conduction ability and high response speed.

In combination with the inherent advantages of nitride semiconductor such as high breakdown electric field strength, this two-dimensional electron gas or two-dimensional hole gas can be used to fabricate high mobility transistors, and its neutral energy is significantly superior to traditional Si or GaAs devices in high energy, high voltage or high frequency applications. However, the existing structure has many defects, which seriously restricts its application range.

SUMMARY OF THE INVENTION

In view of the technical problems existing in the prior art, the present disclosure provides a semiconductor device, which comprises a semiconductor device layer including one or more semiconductor devices; a first electrode interconnection layer disposed on a first side of the semiconductor device layer; one or more first metal pillars disposed on the first side of the semiconductor device layer and electrically connected to the first electrode interconnection layer; a first insulating material disposed around the one or more first metal pillars, wherein the first insulating material is an injection molding material; and a second electrode interconnection layer disposed on a second side opposite to the first side of the semiconductor device layer.

The semiconductor device as described above, wherein one or more semiconductor devices in the semiconductor device layer comprise: one or more of a Schottky diodes, HEMTs, and HHMTs.

The semiconductor device as described above, wherein one or more of the semiconductor devices in the semiconductor device layer have vertical channels.

The semiconductor device as described above, wherein the second electrode interconnection layer is electrically connected to a second electrode on the second side of the semiconductor device layer.

The semiconductor device as described above, wherein the first metal pillars are copper pillars.

The semiconductor device as described above, wherein the height of the first metal pillars are greater than 60 microns, greater than 80 microns, or greater than 100 microns.

The semiconductor device as described above, wherein the first insulating material is distributed, by injection molding, around the one or more metal pillars.

The semiconductor device as described above, wherein the first insulating material is an organic material.

The semiconductor device as described above, wherein the first insulating material is one or more of epoxy resin EP, polystyrene PS, ABS, polycarbonate PC, high density polyethylene (HDPE), polypropylene (PP), and polyvinyl chloride The semiconductor device as described above further comprises one or more second metal pillars disposed on a second side of the semiconductor device layer and electrically connected to the second electrode interconnection layer; and a second insulating material disposed around the one or more second metal pillars, wherein the second insulating material is an injection molding material.

The semiconductor device as described above further comprises a third electrode interconnection layer disposed on the first side of the semiconductor device layer; and one or more third metal pillars disposed on the first side of the semiconductor device layer and electrically connected to the third electrode interconnection layer; wherein the first insulating material is configured to also be distributed around the one or more third metal pillars.

According to another aspect of the present disclosure, there is proposed a semiconductor device obtained by dicing from the semiconductor device according to any one.

According to another aspect of the present disclosure, there is proposed a semiconductor device obtained by dicing and packaging a semiconductor device according to any one of the above.

According to another aspect of the present disclosure, there is provided a method for manufacturing a semiconductor device, comprising forming one or more first metal pillars on the first electrode interconnection layer on the first side of a semiconductor device layer; injecting a first insulating material so that the first insulating material is distributed around the one or more first metal pillars; Removing the substrate; and forming a second electrode interconnection layer on a second side opposite to the first side of the semiconductor device layer; wherein the height of the first metal pillar is greater than 60 microns, greater than 80 microns, or greater than 100 microns.

The method as described above further comprises forming a second electrode on the second side opposite to the first side of the semiconductor device layer after removing the substrate.

The method as described above further comprises removing part of the first insulating material and exposing the one or more first metal pillars.

The method as described above further comprises forming a third electrode interconnection layer on the first side of the semiconductor device layer, and forming one or more third metal pillars on the third electrode interconnection layer on the first side of the semiconductor device layer; wherein the step of injecting the first insulating material further comprises distributing the first insulating material around the one or more third metal pillars.

The method as described above, further comprises: forming one or more second metal pillars on the second electrode interconnection layer on the second side of the semiconductor device layer; injecting a second insulating material such that the insulating material is distributed around the one or more second metal pillars.

According to another aspect of the present disclosure, there is provided a method for manufacturing a semiconductor device, comprising: forming a semiconductor device layer on a substrate, which includes one or more semiconductor devices; forming a first electrode interconnection layer on a first side of the semiconductor device layer; forming one or more first metal pillars on the first electrode interconnection layer on the first side of the semiconductor device layer; injecting a first insulating material so that the first insulating material is distributed around the one or more first metal pillars; removing the substrate; and forming a second electrode interconnection layer on a second side opposite to the first side of the semiconductor device layer; wherein the height of the first metal pillar is greater than 60 microns, greater than 80 microns, or greater than 100 microns.

The method as described above further comprises forming one or more third metal pillars on the third electrode interconnection layer on the first side of the semiconductor device layer; wherein the step of injecting the first insulating material further comprises distributing the first insulating material around the one or more third metal pillars.

The method as described above, further comprising: forming one or more second metal pillars on the second electrode interconnection layer on the second side of the semiconductor device layer; injecting a second insulating material such that the insulating material is distributed around the one or more second metal pillars.

The method as described above, further comprising: dicing the semiconductor device layer so that the one or more semiconductor devices are separated.

The method as described above, further comprising: packaging the separated one or more semiconductor devices.

In the technical scheme of the present disclosure, the temporary substrate is not required to achieve better support strength and complete the related processes of the semiconductor manufacturing process, which is convenient, convenient and low in cost.

BRIEF DESCRIPTION OF THE DRAWINGS

Hereinafter, the preferred embodiment of the present disclosure will be described in further detail with reference to the accompanying drawings, in which.

SPECIFIC IMPLEMENTATION

Figure 1:
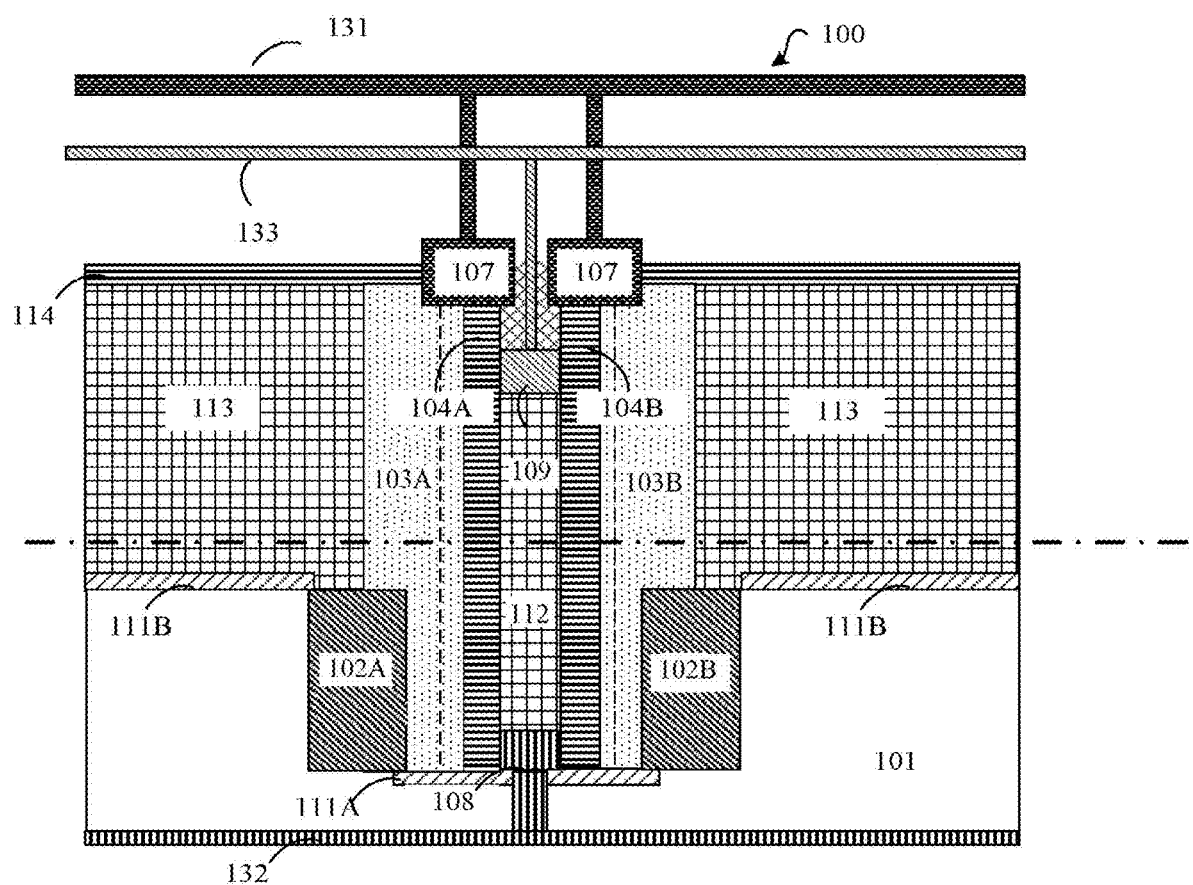
FIG. 1 is a schematic cross-sectional structure diagram of a single-channel HEMT according to an embodiment of the present disclosure.

In order to make the objects, technical solutions and advantages of the embodiments of the present disclosure more clear, the technical solutions in the embodiments of the present disclosure will be clearly and completely described below in combination with the drawings in the embodiments of the present disclosure. Obviously, the described embodiments are part of the embodiments of the present disclosure, not all of the embodiments. All the other embodiments obtained by those skilled in the art based on the embodiments of the present disclosure without creative efforts will fall within the scope of protection of the present disclosure.

In the following detailed description, reference may be made to the drawings of the specification which are a part of the present application to explain specific embodiments of the present application. In the drawings, similar reference numerals describe generally similar components in different figures. Each specific embodiment of the present application is described in sufficient detail below, so that ordinary technicians with relevant knowledge and technology in the art can implement the technical solution of the present application. It is understood that other embodiments may be utilized, or structural, logical or electrical changes may be made to the embodiments of the present application.

The present disclosure provides a semiconductor device, wherein two electrodes are respectively positioned on both sides of the semiconductor device. In some embodiments of the present disclosure, such a structure can not only improve the withstand voltage of the semiconductor device, but also facilitate the circuit interconnection of the semiconductor device. In some embodiments of the present disclosure, the substrate can be partially or completely removed, thereby reducing or avoiding the influence of the substrate (especially the heterogeneous substrate, such as the silicon substrate) on the device performance.

The semiconductor device proposed by the present disclosure can be Schottky diode, HEMT, HHMT or other semiconductor devices. The following takes HEMT as an example for description.

FIG. 1 is a schematic structural diagram of a HEMT according to an embodiment of the present disclosure. In this embodiment, the HEMT 100 is a dual-channel device, which includes two vertical two-dimensional electron gas 2 DEGs as conductive channels. Referring to the embodiment shown in FIG. 1, those skilled in the art can fully obtain a single-channel device including only one vertical 2 DEG, which is also within the protection scope of the present disclosure.

As shown in the figure, the HEMT 100 includes a substrate 101, a first nucleation layer 102A and a second nucleation layer 102B. The first nucleation layer 102A and the second nucleation layer 102B are formed on the opposite vertical interface of the substrate 101. In some embodiments, the nucleation layers 102A and 102b may be AlN. Herein, the nucleation layer may also include a buffer layer (not shown). The buffer layer may have a single-layer or multi-layer structure, including one or more of AlN, GaN, AlGaN, InGaN, AlInN, and AlGaInN.

The first channel layer 103A and the second channel layer 103B are formed by epitaxial growth from the nucleation layers 102A and 102B, respectively. Further, the first barrier layer 104A and the second barrier layer 104B are formed by epitaxial growth from the first channel layer 103A and the second channel layer 103B, respectively. The first barrier layer 104A is formed on the right side of the first channel layer 103A, and the two are arranged horizontally to form a first heterojunction therebetween, and a vertical 2 DEG is formed in the first heterojunction. The second barrier layer 104B is formed on the left side of the second channel layer 103B, and the two are arranged horizontally to form a second heterojunction therebetween, and a vertical 2 DEG is formed in the second heterojunction. Under normal growth conditions, the surface of the channel layer and the barrier layer grown on the Si (111), Al2O3 (0001) and SiC (0001) planes is the (0001) plane, that is, the direction from the Si substrate to the channel layer and the barrier layer is the <0001> crystal direction. In such a crystal direction, there is 2 DEG in the channel layer near the interface between the channel layer and the barrier layer. As those skilled in the art know, if the first barrier layer 104A is formed on the left side of the first channel layer 103A, or the second barrier layer 104B is formed on the right side of the second channel layer 103B, there are two-dimensional hole gas 2 DHG in the channel layer near the interface between the channel layer and the barrier layer according to the crystal direction. Thus, a dual channel HHMT can be obtained.

As shown in FIG. 1, the first channel layer 103A and the second channel layer 103B are partially formed on the side surfaces of the nucleation layers 102A and 102B, and extend to occupy the space between the nucleation layers 102A and 102B. In some embodiments, other portions before the nucleation layers 102A and 102B may be filled with an insulating material 112, such as SiO2 or the like.

As shown in FIG. 1, the portions of the substrate 101 that extend horizontally below and above the nucleation layers 102A and 102B may include spacer layers 111A and 111B, respectively, to cover the horizontal surface of the substrate 101 and separate the substrate 101 from other parts of the device, thereby further improving the withstand voltage capability. The spacer layers 111A and 111B are electrically insulating and include one or more of silicon oxide, silicon nitride, and the like.

In some embodiments, the shielding layer 113 may be included above the partition layer 111B extending horizontally above the nucleation layer 102A. An insulating layer 114 may be included on the shielding layer 113. The shielding layer 113 and the insulating layer 114 can provide support and protection for the device. The shielding layer 113 and the insulating layer 114 are electrically insulated and include one or more of silicon oxide, silicon nitride, and the like.

In some embodiments, the first and second channel layers 103A and 103B may be defined by holes. For example, after forming the nucleation layers 102A and 102B, the shielding layer 113 may be deposited. The height of the shielding layer 113 may be determined according to the height of the desired heterojunction. A first hole and a second hole may be formed on the shielding layer 113. The first hole extends downward to expose the nucleation layer 102A. The first hole extends downward to expose the nucleation layer 102B. Further, the first and second channel layers 103A and 103B may be epitaxially grown from the nucleation layers 102A and 102B, and the first and second holes may be filled. Thus, the shapes of the first and second channel layers 103A and 103B may be defined by the first and second holes.

Further, the first and second barrier layers 104A and 104B may be defined by holes. For example, after forming the first and second channel layers 103A and 103B, two other third and fourth holes are formed on the shield layer 113, exposing the left and right sides of the first and second channel layers 103A and 103B, respectively; then, the first and second barrier layers 104A and 104B may be epitaxially grown on the side surface of the channel layer exposed in the hole, respectively, and the hole may be filled. Thus, the shapes of the first and second barrier layers 104A and 104B may also be defined by holes.

The heterojunction structure defined by the hole according to the present disclosure has the following advantages: according to the actual needs, a hole structure that can meet the needs can be formed first, and then devices that are difficult to realize by conventional means can be gradually formed in the hole. For example, in the prior art, it is easy to form a structure with a low aspect ratio by epitaxial growth; however, it is often difficult to form a structure with an aspect ratio. When its vertical height is high and its width is small, the traditional epitaxial growth method is difficult to achieve. As disclosed in some embodiments of the present disclosure, such a structure can be easily realized by the hole structure proposed by the present disclosure. On the other hand, a 2 DEG having a high height can be formed by groove definition. In the HEMT formed in this way, when the horizontal projection distance between the electrodes is constant, the on current between the source and drain stages is larger, so that it is easier to obtain a high-power HEMT.

In some embodiments, the aspect ratio of the channel layer to the barrier layer of the semiconductor device of the present disclosure may be 1:2, 1:5, or 1:20. For example, the length of the bottom of both the channel layer and the barrier layer is 1 1 μm (micrometer), and the height of the channel layer 103 and the barrier layer 104 may be 2 μm, 5 μm, 20 μm. In fact, through the definition of the hole, any desired aspect ratio can be realized with the help of the hole.

In a general application, the channel layer and the barrier layer are lower than or equal to the height of the hole defined therein. In some special applications, the channel layer and the barrier layer may also extend higher than these holes. However, the growth of the channel layer and the barrier layer may be more difficult to control due to the loss of the limitation of the hole. Therefore, even if the channel layer and the barrier layer are higher than these holes, the higher height will be limited.

In this embodiment, the HEMT 100 includes a first electrode 107 and a second electrode 108. The first electrode 107 is positioned on the upper side of the first heterojunction and is in electrical contact with the 2 DEG in the first heterojunction.

The upper side mentioned here refers to the part above the center line of the first heterojunction. Based on the height of the first heterojunction, the horizontal line position at ½ of the height is the center line position of the first heterojunction. Refer to the position of the dotted line in FIG. 1. The region above the center line position is the upper side of the first heterojunction. The first electrode may be positioned at any position on the upper side that can make electrical contact with the vertical 2 DEG of the first heterojunction. For example, the first electrode 107 may be in contact with the vertical 2 DEG from the upper surface of the first heterojunction as shown in FIG. 1; alternatively, the first electrode 107 may be in electrical contact with the 2 DEG perpendicular to the first heterojunction from the first barrier layer side; alternatively, the first electrode 107 may be in electrical contact with the 2 DEG perpendicular to the first heterojunction from the first channel layer side. The present disclosure is not limited thereto.

Similarly, the second electrode 108 is positioned on the lower side of the first heterojunction and is in electrical contact with the 2 DEG within the first heterojunction. The lower side mentioned here refers to the part below the center line of the first heterojunction. For example, as shown in FIG. 1, the second electrode 108 is in electrical contact with the 2 DEG perpendicular to the first heterojunction from the side of the first barrier layer. Preferably, the first electrode 107 and the second electrode 108 are as far away as possible to maximize the length of the vertical conductive channel and improve the voltage withstand performance of the device.

Referring to FIG. 1, since the first electrode 107 and the second electrode 108 are positioned on the upper side and the lower side of the center line of the first heterojunction, respectively, the projection of the first electrode and its connecting conductor on the vertical channel plane does not overlap the projection of the second electrode and its connecting conductor on the vertical channel plane. Further, on the third plane perpendicular to the vertical channel plane and the horizontal plane, the projection of the first electrode and its connecting conductor on the vertical channel plane does not overlap with the projection of the second electrode and its connecting conductor on the vertical channel plane.

As shown in FIG. 1, for the dual channel HEMT 100, the first electrode 107 and the second electrode 108 are also in electrical contact with the vertical 2 DEG of the second heterojunction as the other channel, thereby forming a dual channel semiconductor device. The increased conductive channel can increase the on current and thus have higher power; moreover, the double conductive channel has better pressure resistance and heat resistance than the single conductive channel Also, the same attribute electrodes of the double conductive channel structure may be shared. Those skilled in the art should note that although the first electrode 107 in FIG. 1 includes two parts corresponding to the first heterojunction and the second heterojunction, these two parts are electrically connected to the same conductor interconnection layer, and thus can be considered as one electrode.

In some embodiments, one of the first electrode 107 and the second electrode 108 may be in ohmic contact with the first and second heterojunction; the other is in contact with the first and second heterojunction Schottky, and forms a Schottky diode by using the characteristics of the Schottky contact, which is also a semiconductor device protected by the present disclosure.

In some embodiments, above the first heterojunction shown in FIG. 1, a first conductor interconnection layer 131 is included, which is electrically connected to the first electrode 107. Not surprisingly, the first conductor interconnection layer 131 is also positioned on the upper side of the first heterojunction. The fabrication and interconnection of the first conductor interconnection layer 131 are well known to those skilled in the art and will not be described here again.

In some embodiments, the lower part of the first heterojunction shown in FIG. 1 includes a second conductor interconnection layer 132, which is electrically connected to the second electrode 108. Not surprisingly, the second conductor interconnection layer 132 is also positioned on the lower side of the second heterojunction. As known to those skilled in the art, the second conductor interconnection layer 132 can be formed in various ways and electrically connected to the second electrode 108. For example, the semiconductor device shown in FIG. 1 may be turned over, and then through holes may be formed on the substrate 101 to expose the turned over second electrode 108; next, the second conductor interconnection layer 132 may be formed on the substrate 101 by depositing metal or the like, and the through hole may be filled to electrically connect the second conductor interconnection layer 132 and the second electrode 108, thereby obtaining the structure shown in FIG. 1.

In this embodiment, the HEMT 100 further includes a third electrode 109. The third electrode 109 is provided between the first electrode 107 and the second electrode 108. As a gate electrode, it is possible to control the current intensity between the first electrode 107 and the second electrode 108 to form a HEMT structure. Specifically, the voltage of the third electrode 109 can control the depth of the heterojunction potential well formed by the channel layer barrier layer, control the surface charge density of 2 DEG in the potential well, and further control the working current between the first electrode 107 and the second electrode 108. In some embodiments, the length of the third electrode 109 extending horizontally is not less than the length of the 2 DEG 105A to realize the control of the current path between the first electrode 107 and the second electrode 108.

In some embodiments, the second electrode 108 is in ohmic contact with the first and second channel layers 103A and 103B and the first and second barrier layers 104A and 104B, and is preferably connected to a high voltage as a drain. The first electrode 107 is also in ohmic contact, and is preferably used as a source electrode as far as possible from the drain electrode of the second electrode. Further, the center line position of the third electrode 109 is also positioned on the upper side of the first heterojunction, and is as close to the first electrode 107 as possible, so as to increase the distance between the drain and the gate, and effectively improve the withstand voltage performance of the HEMT 100.

In some embodiments, above the first heterojunction shown in FIG. 1, a third conductor interconnection layer 133 is included, which is electrically connected to the third electrode 109. Not surprisingly, the third conductor interconnection layer 133 is also positioned on the upper side of the first heterojunction. The fabrication and interconnection of the third conductor interconnection layer 133 are well known to those skilled in the art and will not be described here. Referring to FIG. 1, since the third electrode is also positioned on the upper side of the first heterojunction, the projection of the third electrode and its connecting conductor on the vertical channel plane does not overlap with the projection of the second electrode and its connecting metal on the vertical channel plane, the projection of the third electrode and its connecting conductor on the third plane does not overlap with the projection of the second electrode and its connecting metal on the third plane.

It should be noted that the interconnection structure of the third electrode 109 passes through the interconnection structure of the first electrode 107, and the entire interconnection structure is positioned within the area defined by the first electrode 107. In this way, there is no need to occupy additional chip area and is conducive to improving the integration of the device.

Figure 2A:
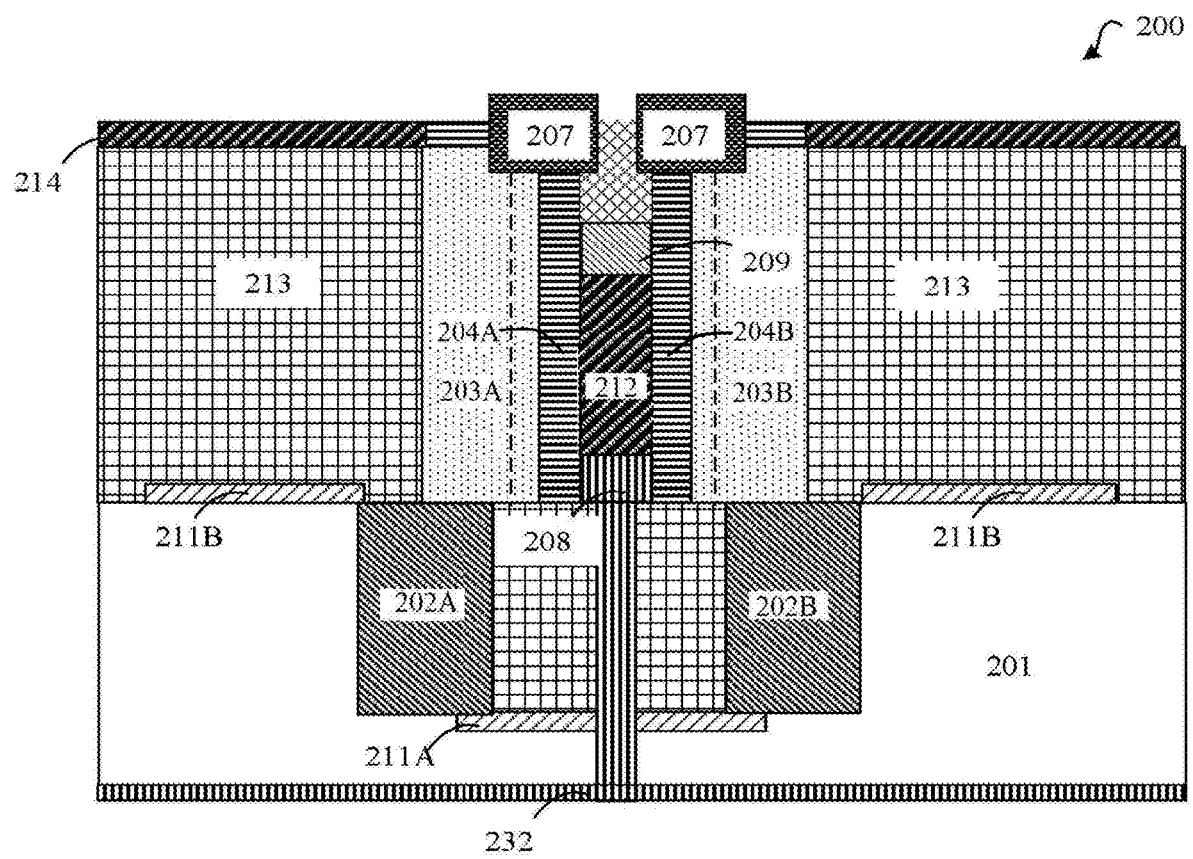
FIG. 2A is a schematic top view structure diagram of a single-channel HHMT according to an embodiment of the present disclosure.
Figure 2B:
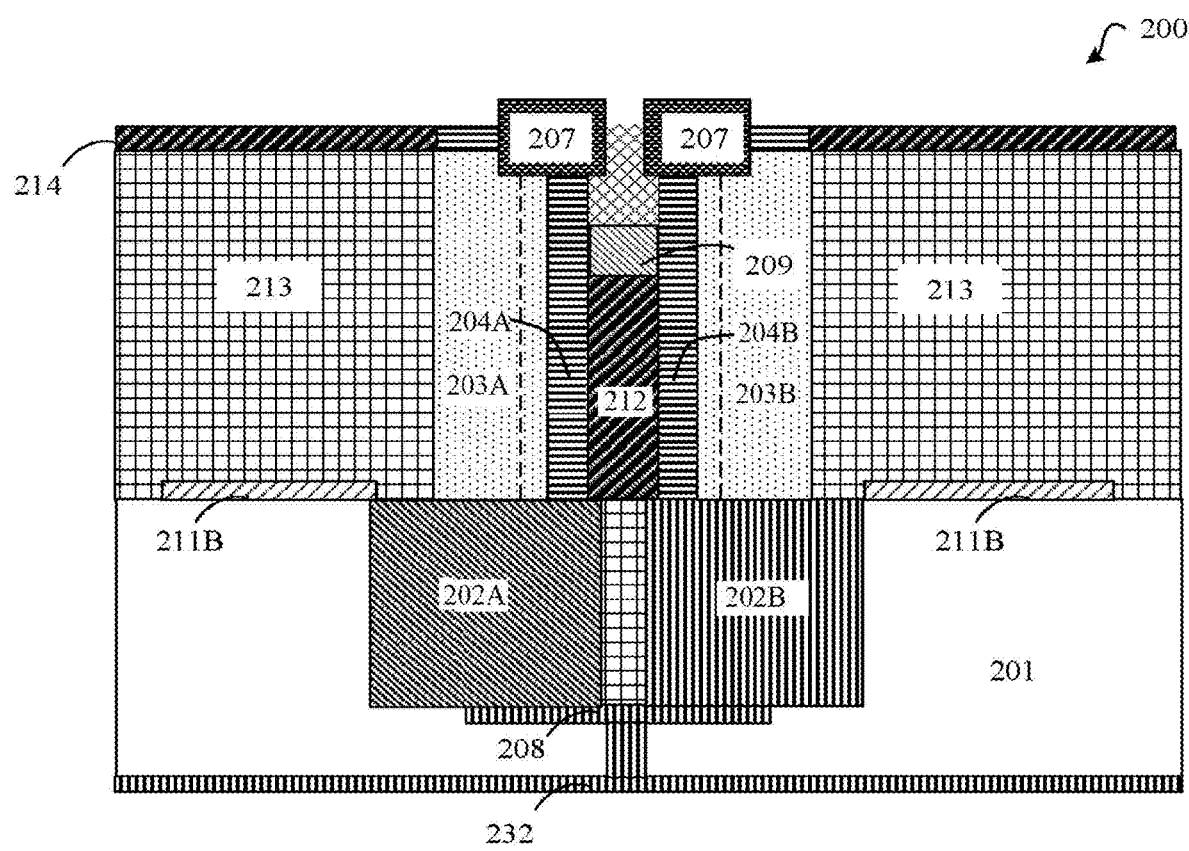
FIG. 2B is a schematic cross-sectional structure diagram of a single-channel HHMT according to an embodiment of the present disclosure.

FIGS. 2A and 2B are schematic structural diagrams of an HEMT according to another embodiment of the present disclosure. As shown in the figure, HEMT 200 is also a dual channel device. The structure of the HEMT 200 is similar to that of the HEMT 100 shown in FIG. 1, and includes a substrate 201, first and second nucleation layers 202A and 202B, first and second channel layers 203A and 203B, and first and second barrier layers 204A and 204B; Wherein a first heterojunction and a second heterojunction are formed between the first and second channel layers 203A and 203B and the first and second barrier layers 204A and 204B, respectively. Further, portions of the substrate 201 extending horizontally above and below the first and second nucleation layers 202A and 202B include separation layers 211A and 211B, respectively, to separate the substrate 201 from other portions of the device. The HEMT 200 further includes an insulating material 212 between the first and second barrier layers 204A and 204B, and a shielding layer 213 above the spacer layer 211B and a protective layer 214 above the shielding layer 213. The HEMT 200 further includes a first electrode 207, a second electrode 208 and a third electrode 209. Parts similar to the structure of the embodiment shown in FIG. 1 have similar functions, and will not be described here.

The difference from the embodiment shown in FIG. 1 is that the first and second channel layers 203A and 203B and the first and second barrier layers 204A and 204B are positioned above the first and second nucleation layers 202A and 202B, so that the first and second heterojunctions are further away from the substrate 201. This can further improve the performance of the HEMT 200. The second conductor interconnection layer 232 is shown in FIGS. 2A and 2B, but the first and third conductor interconnection layers are not shown. The manufacturing of the second conductor interconnection layer 232 and the interconnection with the second electrode 208 may be similar to the embodiment of FIG. 1. The difference between FIG. 2A and FIG. 2B is that in FIG. 2B, the second electrode is positioned below the first and second nucleation layers 202A and 202B, and electrically contacts the first and second heterojunction through the first and second nucleation layers 202A and 202B, respectively. Preferably, the first and second nucleation layers 202A and 202B are doped to have improved conductivity. In some embodiments, the first and second nucleation layers 202A and 202B are doped immediately after the vertical sides of the substrate 201 are formed, and then the first and second channel layers 203A and 203B are formed. In some embodiments, the first and second nucleation layers 202A and 202B are doped after being inverted and exposed again. This can avoid the influence of doping on the lattice of nucleation layer and facilitate the subsequent epitaxial growth. In some embodiments, the first and second nucleation layers 202A and 202B may be the same nucleation layer, and there is no insulating material between them.

It is worth noting that in the embodiment shown in FIG. 2A and FIG. 2B, since the first and second heterojunctions are both positioned above the substrate 201, the insulating material 212 between the entire substrate 201 and the first and second nucleation layers 202A and 202B and between them can be removed without affecting the structure above them. Thus, the influence of the heterogeneous substrate, such as the silicon substrate, on the device performance can be completely avoided.

Figure 3:
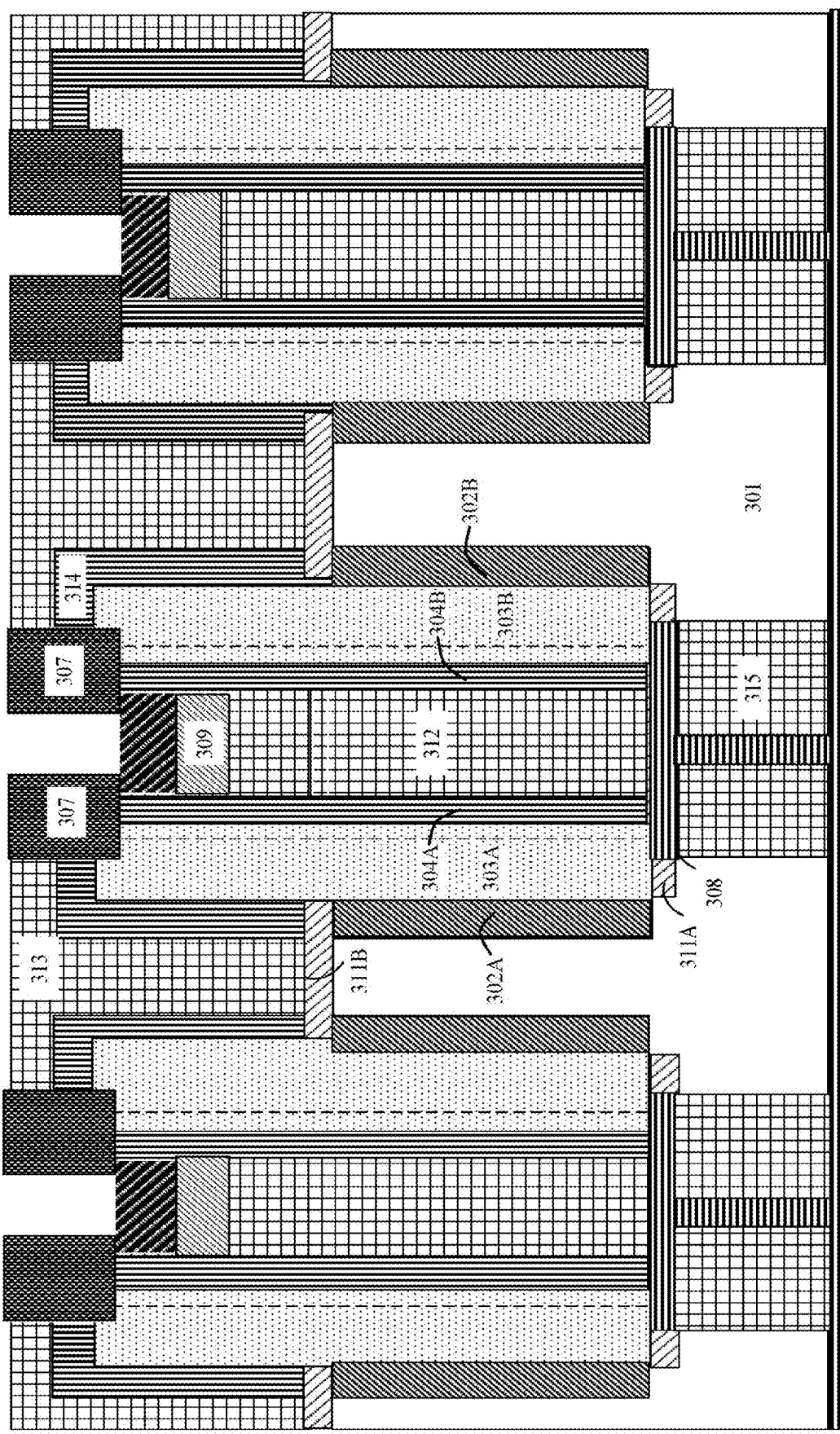
FIG. 3 is a schematic cross-sectional structural diagram of a dual-channel HEMT according to an embodiment of the present disclosure.

FIG. 3 is a schematic structural diagram of an HEMT according to another embodiment of the present disclosure. In order to more clearly illustrate the structure of this embodiment, three dual channel HEMTs 300A-300C are shown in FIG. 3.

Taking HEMT 300A as an example, its structure is similar to that of HEMT 100 shown in FIG. 1, including substrate 301, first and second nucleation layers 302A and 302B, first and second channel layers 303A and 303B, and first and second barrier layers 304A and 304B; wherein a first heterojunction and a second heterojunction are formed between the first and second channel layers 303A and 303B and the first and second barrier layers 304A and 304B, respectively. Further, portions of the substrate 301 horizontally extending above and below the first and second nucleation layers 302A and 302B include separation layers 311A and 311B, respectively, to separate the substrate 301 from other portions of the device. The HEMT 300 further includes an insulating material 312 between the first and second barrier layers 304A and 304B and a shielding layer 313 above the separation layer 311B. Parts similar to the structure of the embodiment shown in FIG. 1 have similar functions, and will not be described here. Unlike the embodiment of FIG. 1, the first and second channel layers 303A and 303B are covered with a protective layer 314 to provide further protection.

The HEMT 300 further includes a first electrode 307, a second electrode 308 and a third electrode 309. The first electrode 307 and the third electrode 309 are similar to the embodiment of FIG. 1. The second electrode 308 can be manufactured in different ways. For example, the semiconductor device shown in FIG. 2 may be inverted, and then a hole may be formed on the substrate 301 to expose the first and second heterojunctions after the inversion; next, the second electrode 308 may be formed on the first and second heterojunctions by depositing metal or the like. Filling the hole with an insulating material 315 after forming the second electrode; Then, through holes are formed in the insulating material 315. Next, a metal is deposited on the entire device surface to form a second conductor interconnection layer 332, and the through hole is filled to electrically connect the second conductor interconnection layer 332 and the second electrode 308, thereby obtaining the structure shown in FIG. 3. In the HEMT structure described in FIG. 3, the substrate 301 only serves as a device support and is sufficiently separated from the active part of the semiconductor device, so that the influence on the device can be further reduced and the performance of the device can be greatly improved.

Figure 4:
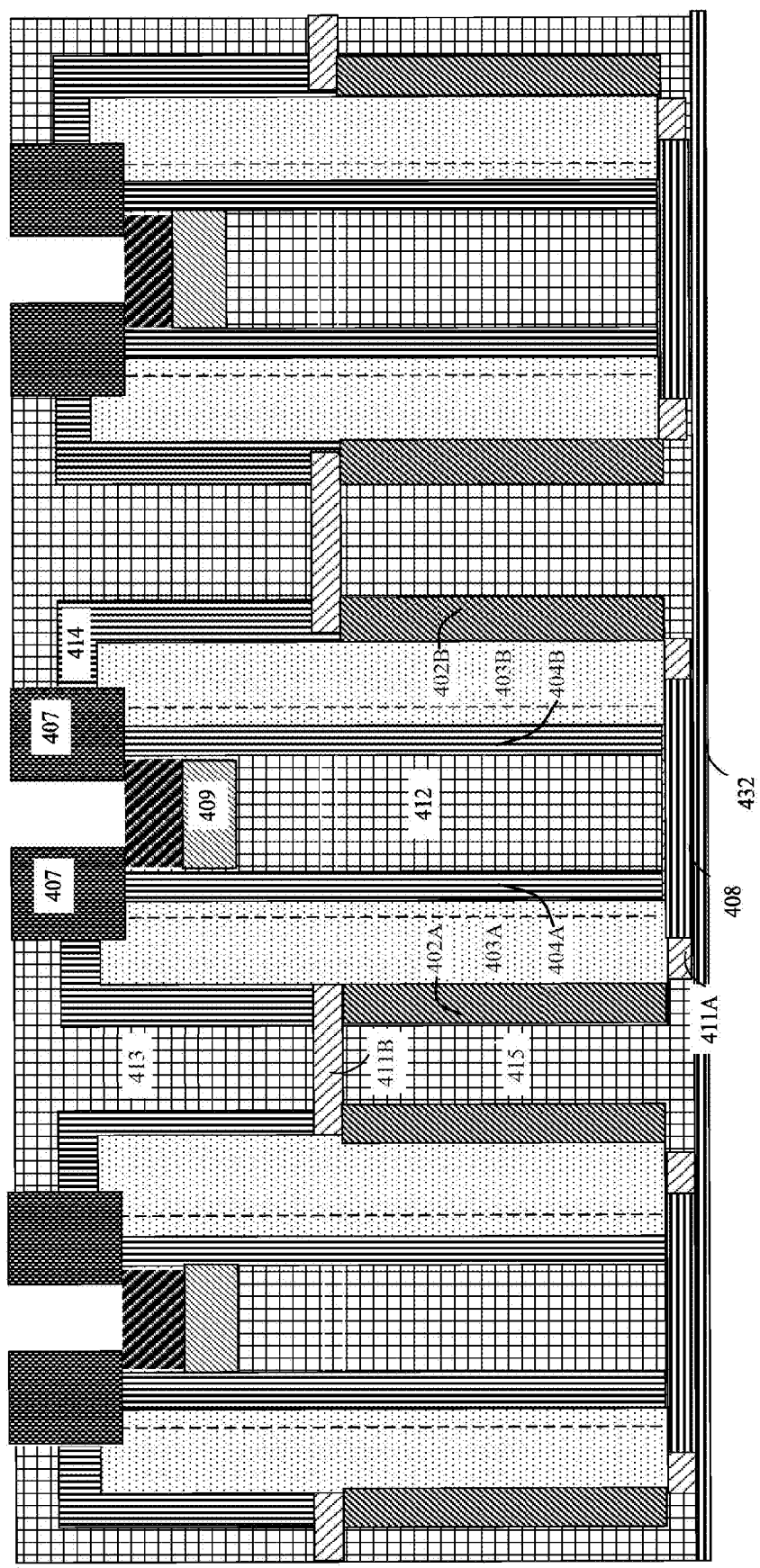
FIG. 4 is a schematic cross-sectional structural diagram of a dual-channel HHMT according to an embodiment of the present disclosure.

FIG. 4 is a schematic structural diagram of an HEMT according to another embodiment of the present disclosure. In order to more clearly explain the structure of this embodiment, three dual channel HEMTs 400A-400C are shown in FIG. 4.

Taking HEMT 400A as an example, its structure is similar to that of HEMT 100 shown in FIG. 1, including first and second nucleation layers 402A and 402B, first and second channel layers 403A and 403B, and first and second barrier layers 404A and 404B; wherein a first heterojunction and a second heterojunction are formed between the first and second channel layers 403A and 403B and the first and second barrier layers 404A and 404B, respectively. Further, the spacer layers 411A and 411B extending horizontally are included above and below the first and second nucleation layers 402A and 402B. The HEMT 400 further includes an insulating material 412 between the first and second barrier layers 404A and 404B and a shielding layer 414 above the separation layer 411B. The HEMT 400 further includes a first electrode 407, a second electrode 408 and a third electrode 409. The first electrode 407 and the third electrode 409 are similar to the embodiment of FIG. 1. Parts similar to the structure of the embodiment shown in FIG. 1 have similar functions, and will not be described here. Unlike the embodiment of FIG. 1, the first and second channel layers 403A and 403B are covered with a protective layer 414 to provide further protection.

The embodiment shown in FIG. 4 is different from the embodiment shown in FIGS. 1-3 in that the substrate is completely removed. A manufacturing method of the embodiment of FIG. 4 will be described based on the embodiment shown in FIG. 2. For example, the semiconductor device shown in FIG. 1 may be inverted, the substrate 401 may be thinned first, and then the entire semiconductor device may be placed in an etching liquid to completely remove the substrate 401, and the first and second heterojunctions after the inversion may be exposed; next, the second electrode 408 may be formed on the first and second heterojunctions by depositing metal or the like, and then the second conductor interconnection layer 432 may be further formed to obtain the structure shown in FIG. 4. The hole between the respective HEMTs may be filled with an insulating material 415. This step may be performed before or after the second electrode 408 is formed. Those skilled in the art should note that although FIG. 4 shows the spacer layer 411A and the insulating material 415 filled after the removal of the parallel substrate, this schematic illustration cannot be used due to the thin thickness of the spacer layer 411A represents the actual structure.

In the HEMT structure described in FIG. 4, the substrate 401 is completely removed, so that the influence of the substrate, especially the heterogeneous substrate (such as silicon substrate), on the device can be avoided, and the performance of the device can be greatly improved. Further, FIG. 4 shows a semiconductor device formed by removing a substrate from the structure of FIG. 2.

In some embodiments, in the step of removing the substrate as described above, the substrate, the nucleation layer and the insulating material between the nucleation layers may also be completely removed, and only the part above the substrate in the structure shown in FIG. 2 may be retained; and then the second electrode and the second conductor interconnection layer are formed. Similarly, from the structure of FIG. 1, a semiconductor device after substrate removal can also be obtained. These modes are also within the scope of the present disclosure.

The present disclosure also includes a method for manufacturing a semiconductor device. Taking the manufacturing process of the dual channel HEMT shown in FIG. 4 as an example, the manufacturing method of the semiconductor device of the present disclosure will be described. Semiconductor devices of other structures can also be manufactured by similar methods.

Figure 5B:
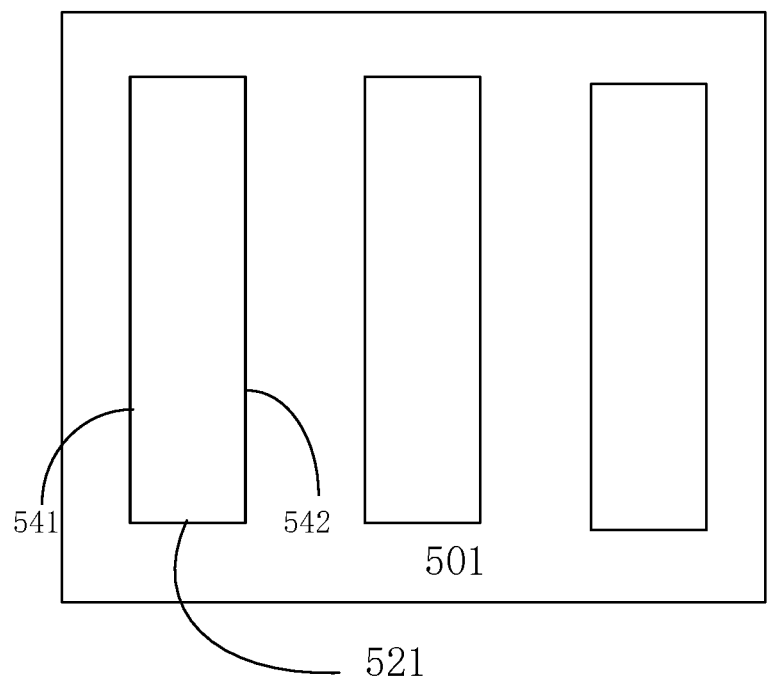
FIG. 5AA-5VB are schematic flowcharts of a method for preparing a dual-channel HHMT according to an embodiment of the present disclosure.
Figure 5B:
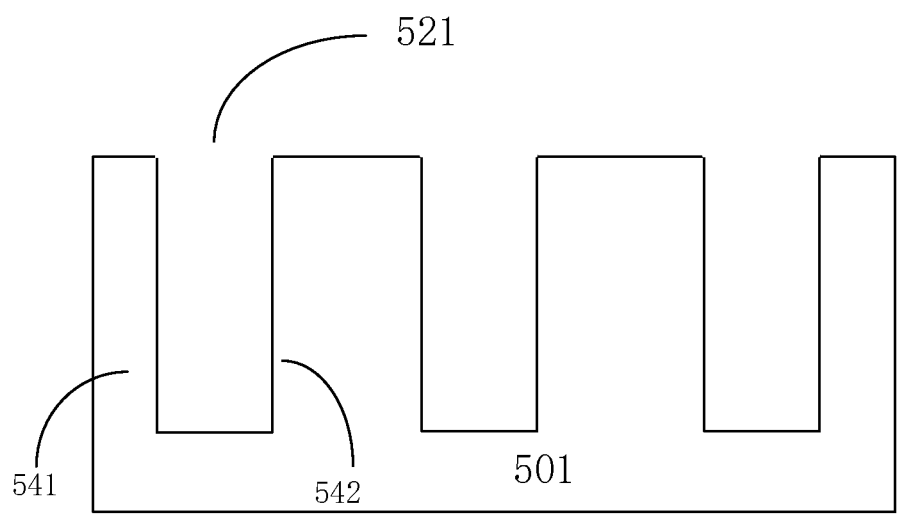
Figure 5C:
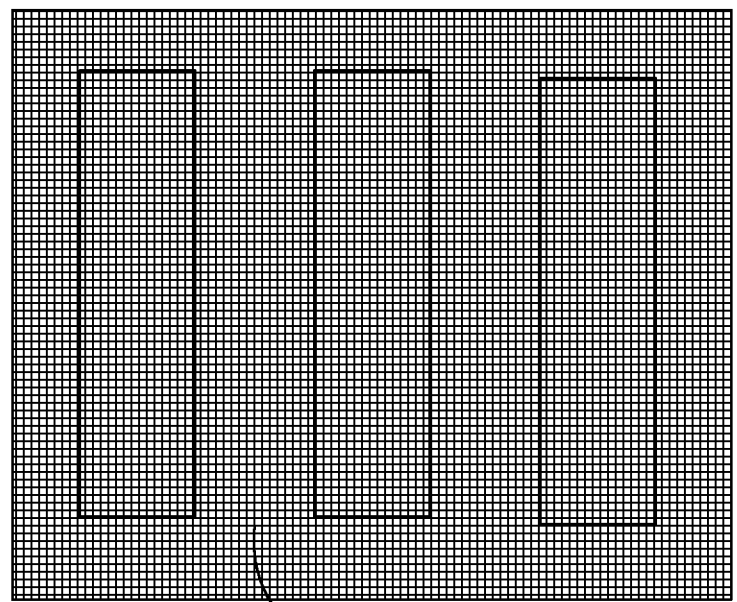
Figure 5C:
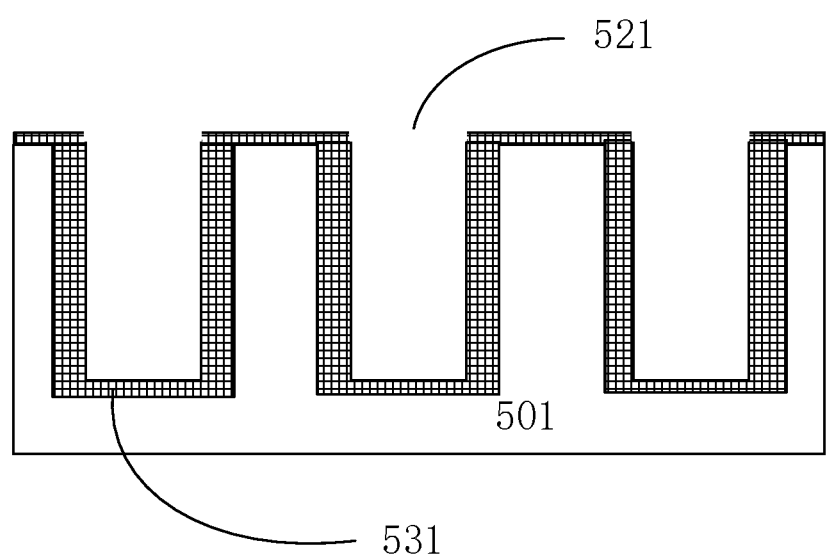
Figure 5D:
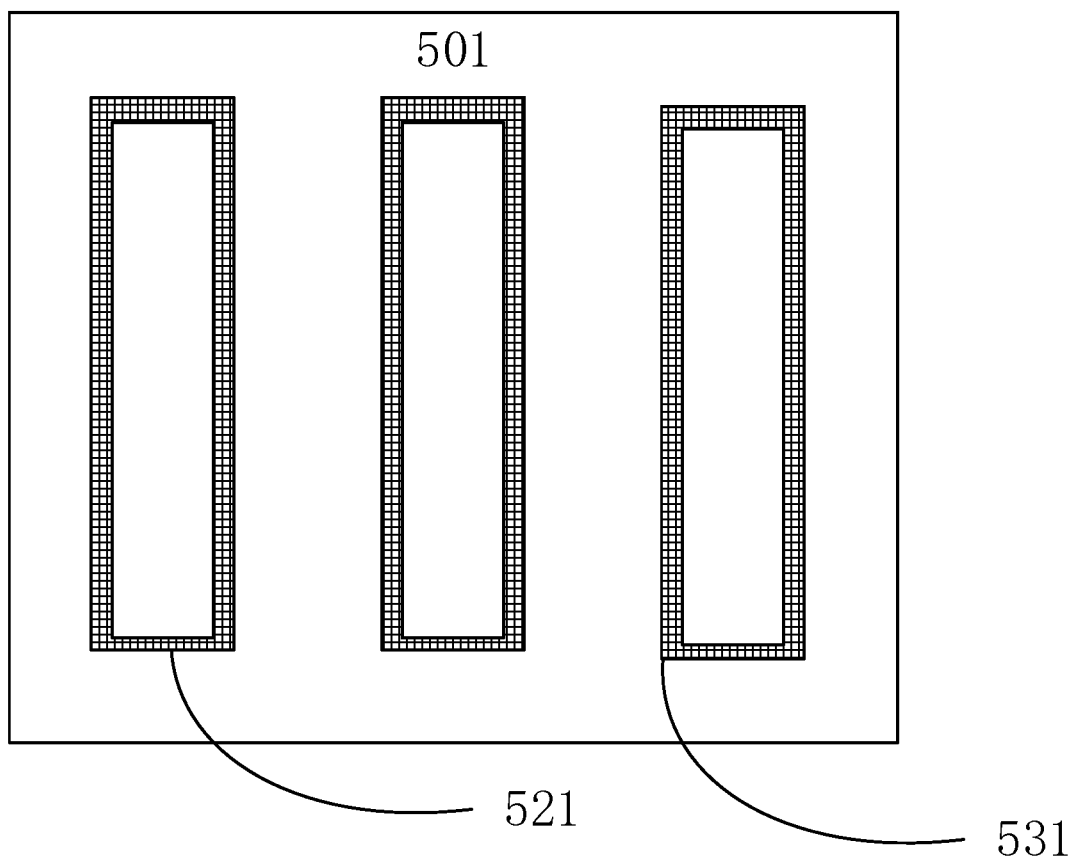
Figure 5D:
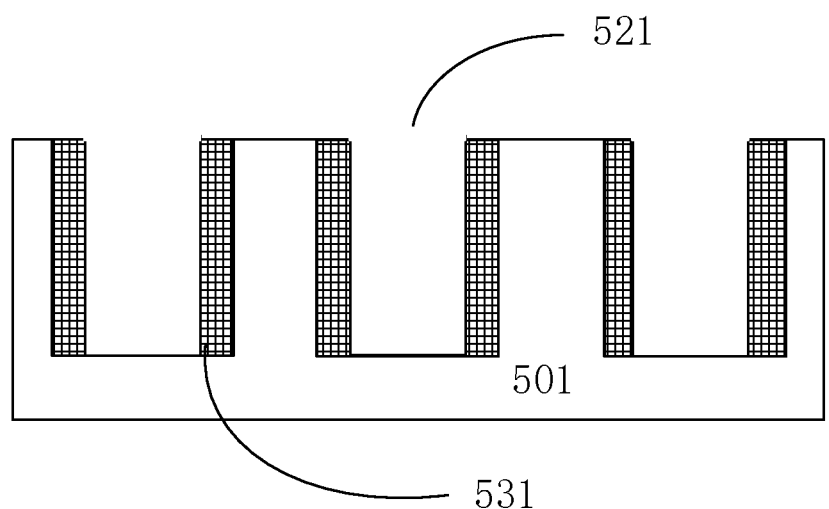
Figure 5E:
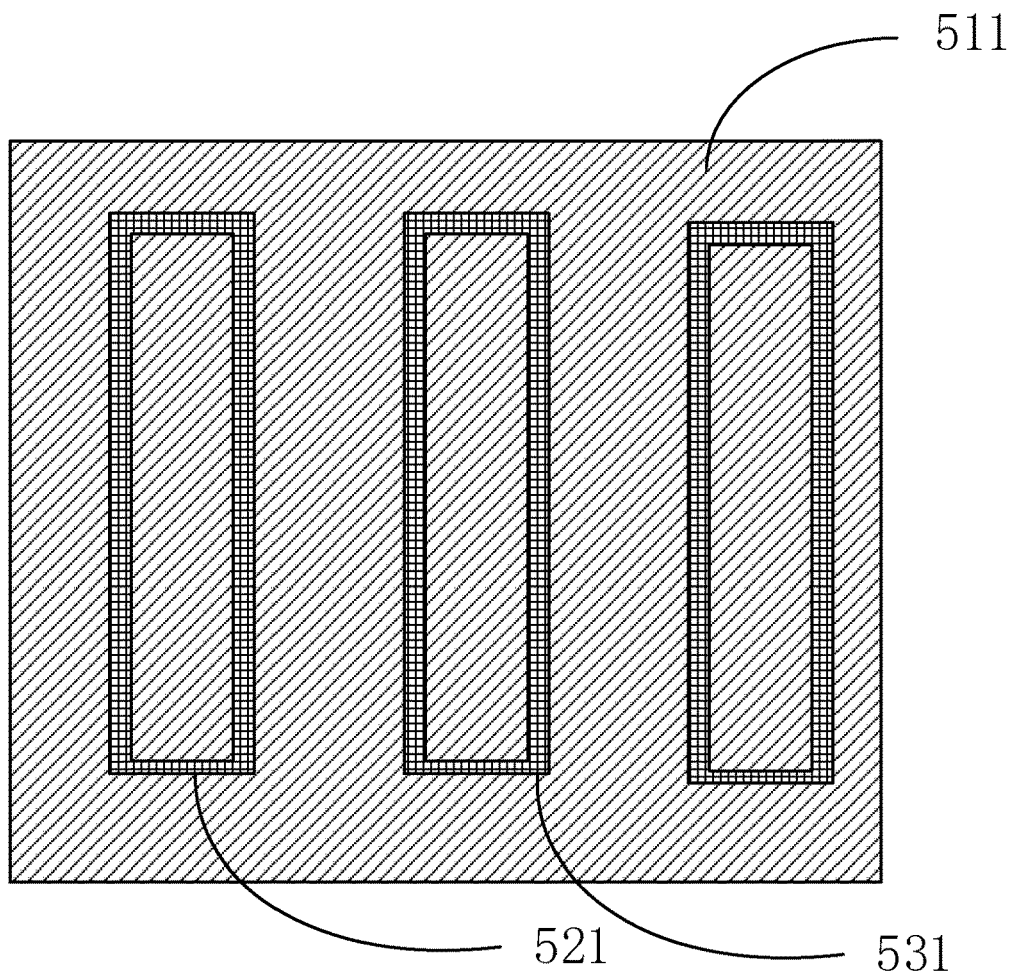
Figure 5E:
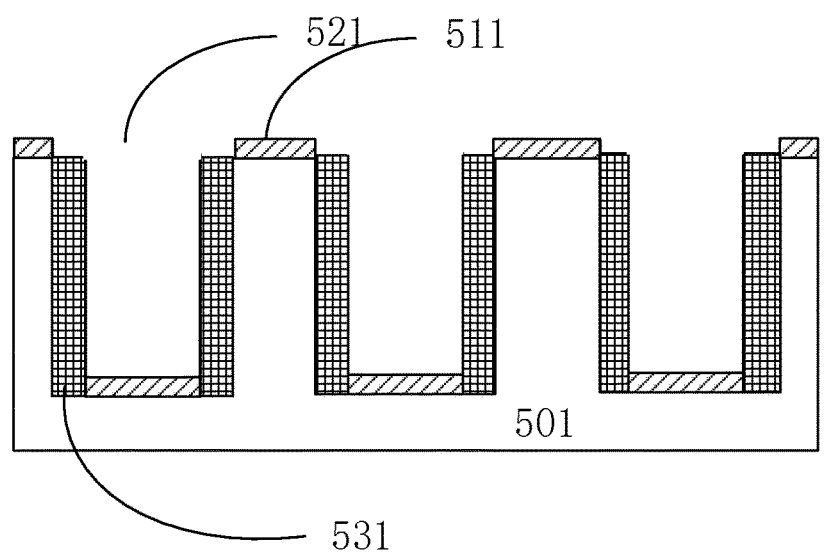
Figure 5F:
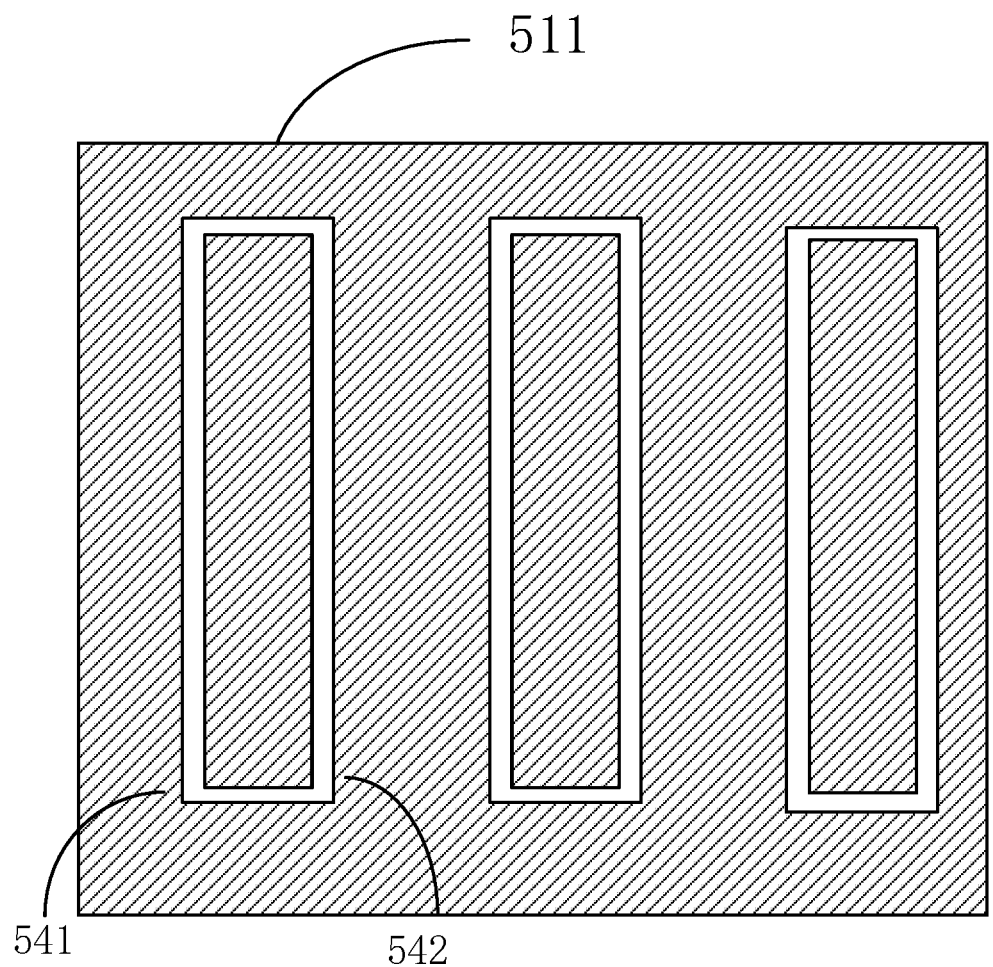
Figure 5F:
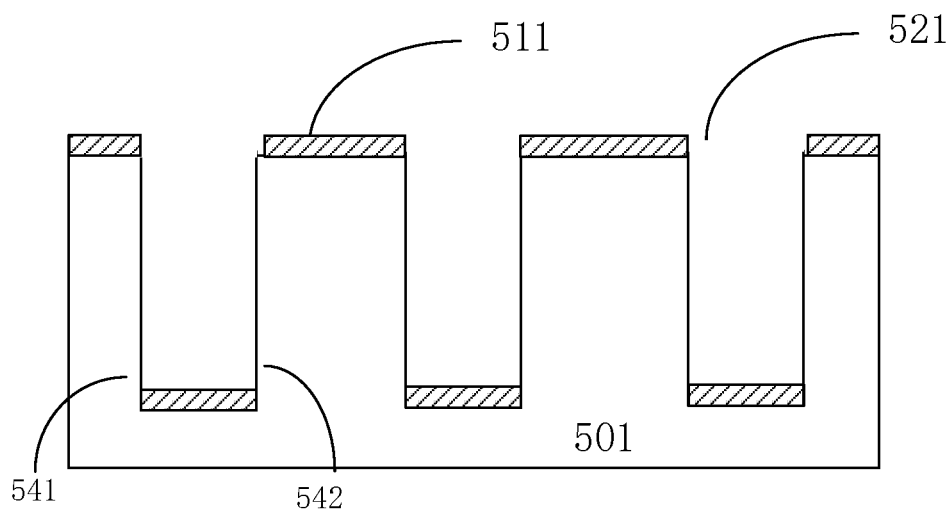
Figure 5G:
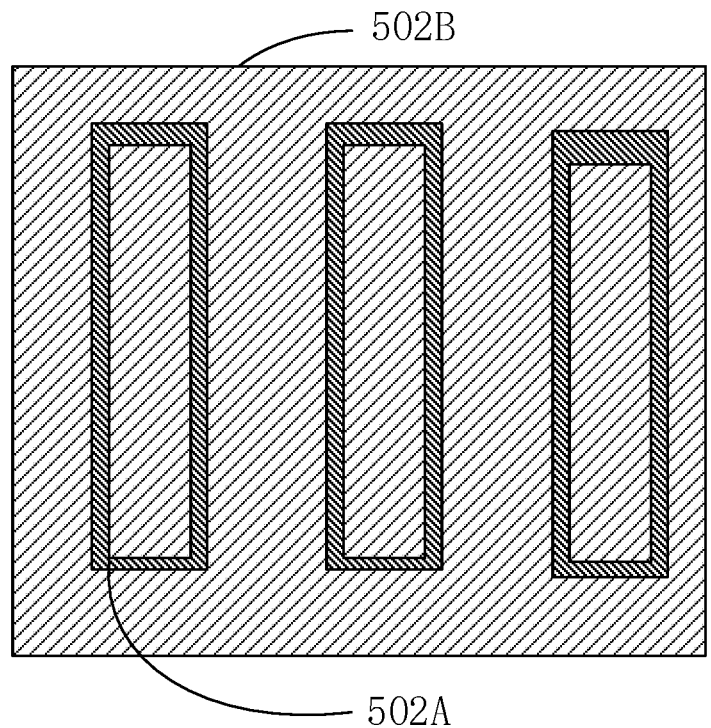
Figure 5G:
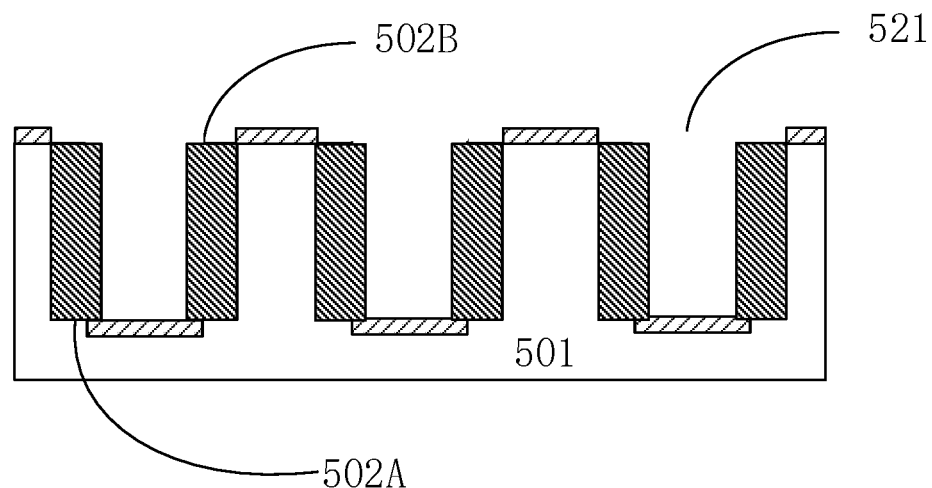
Figure 5H:
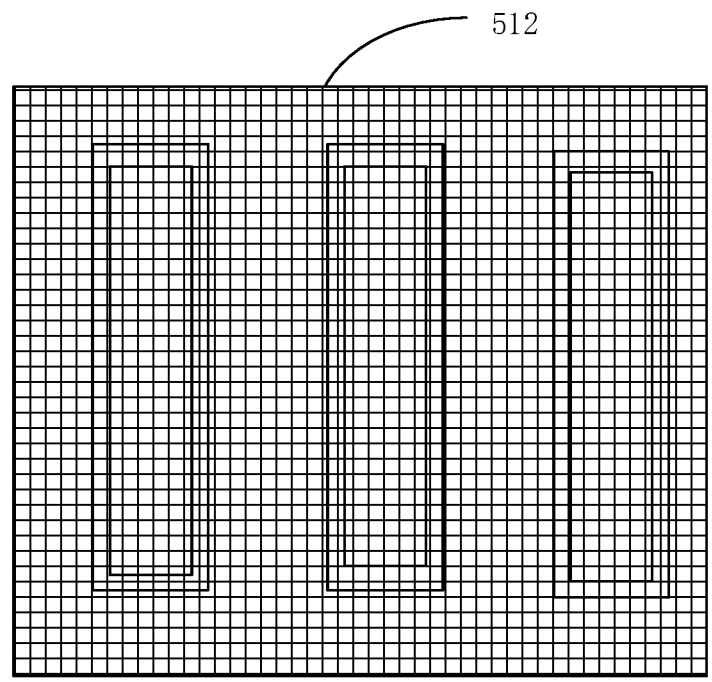
Figure 5H:
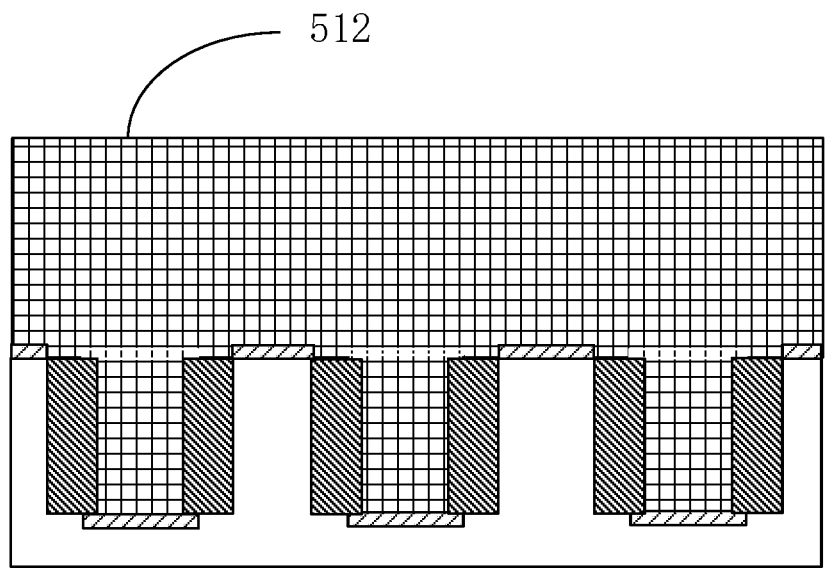
Figure 5I:
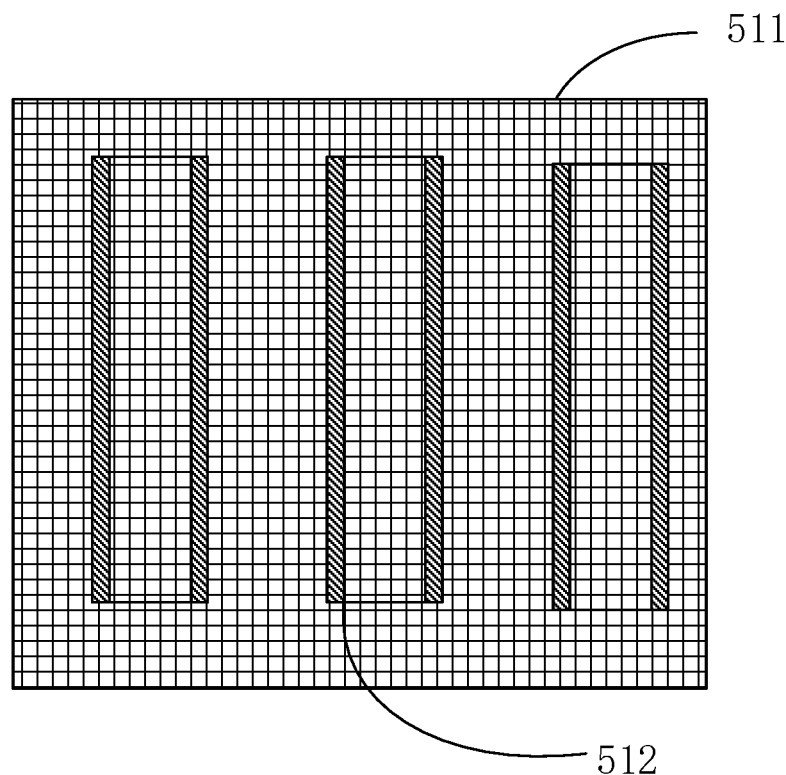
Figure 5I:
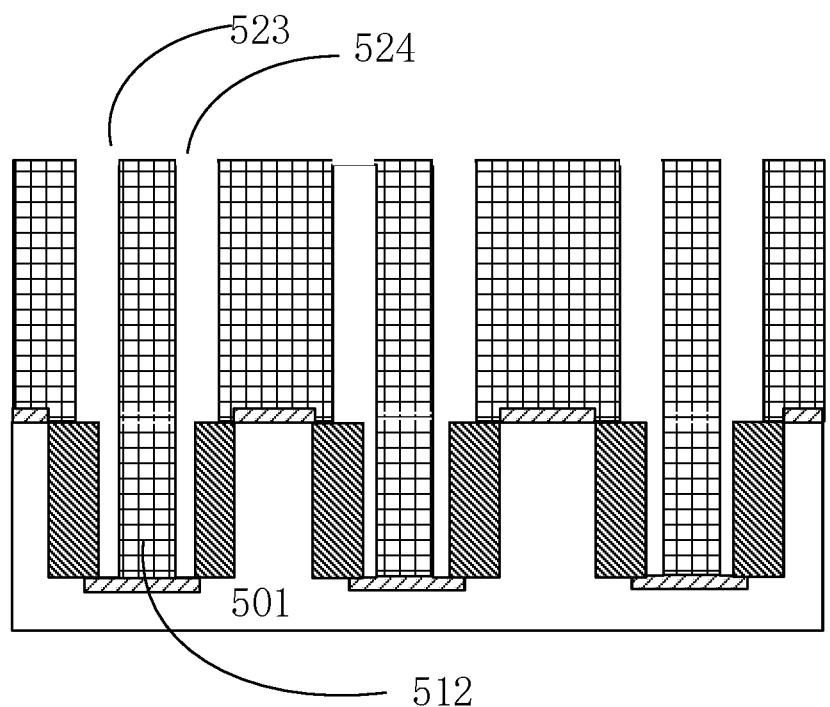
Figure 5J:
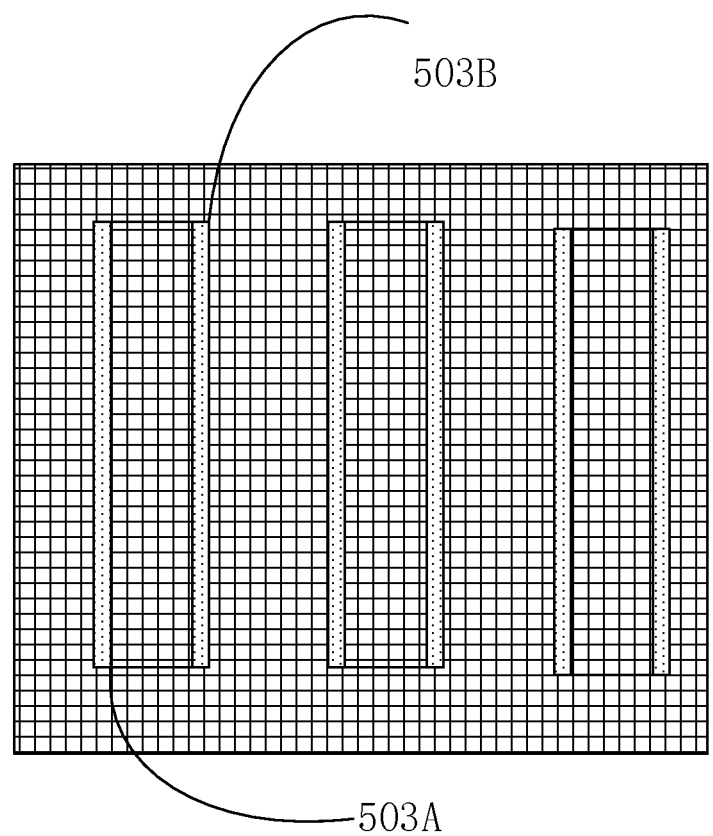
Figure 5J:
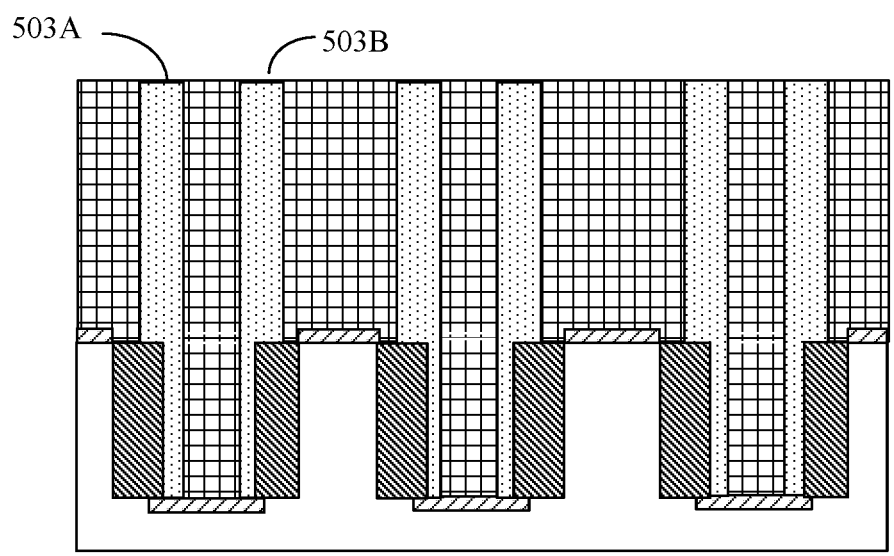
Figure 5K:
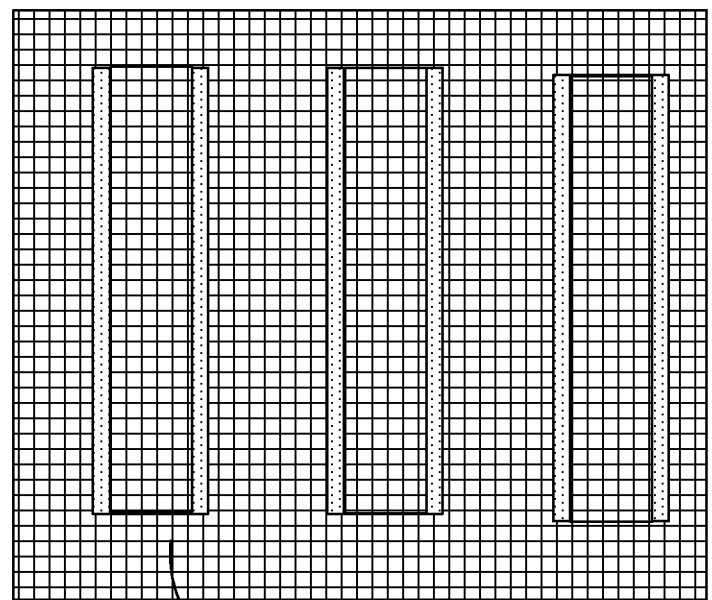
Figure 5K:
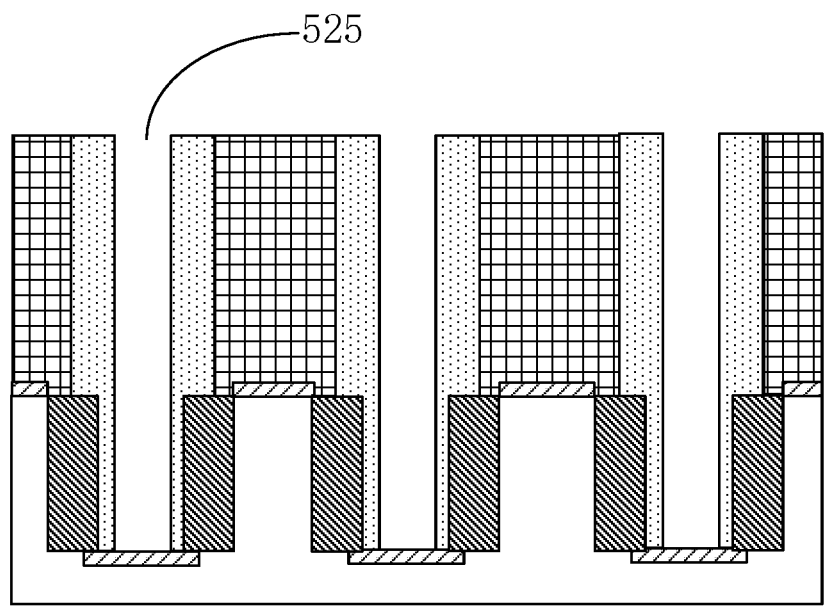
Figure 5L:
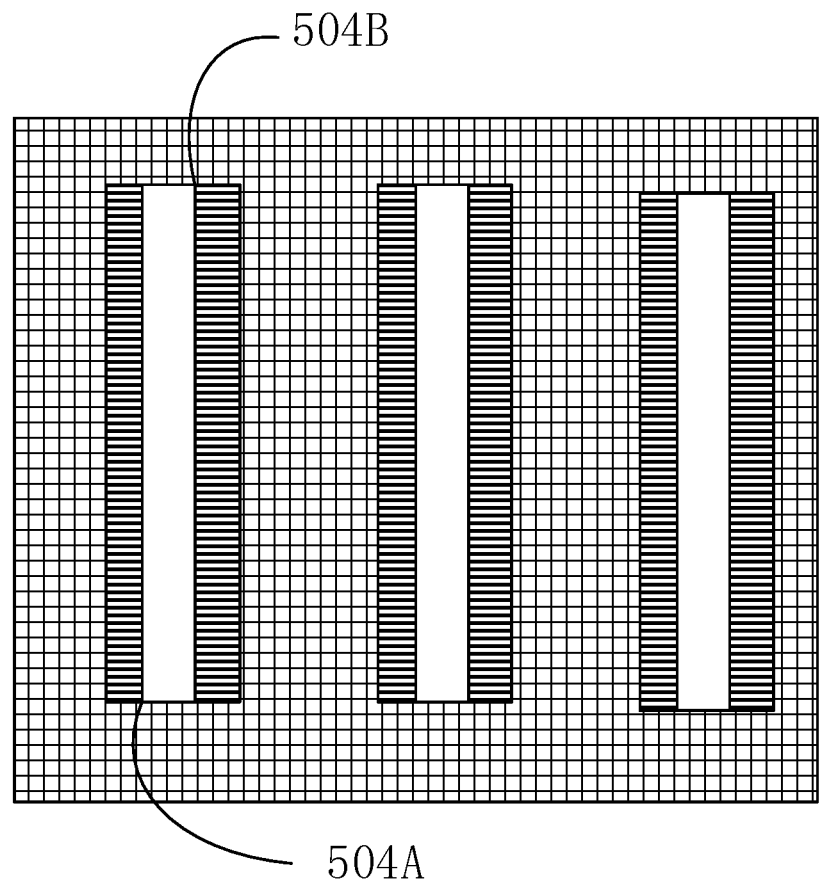
Figure 5L:
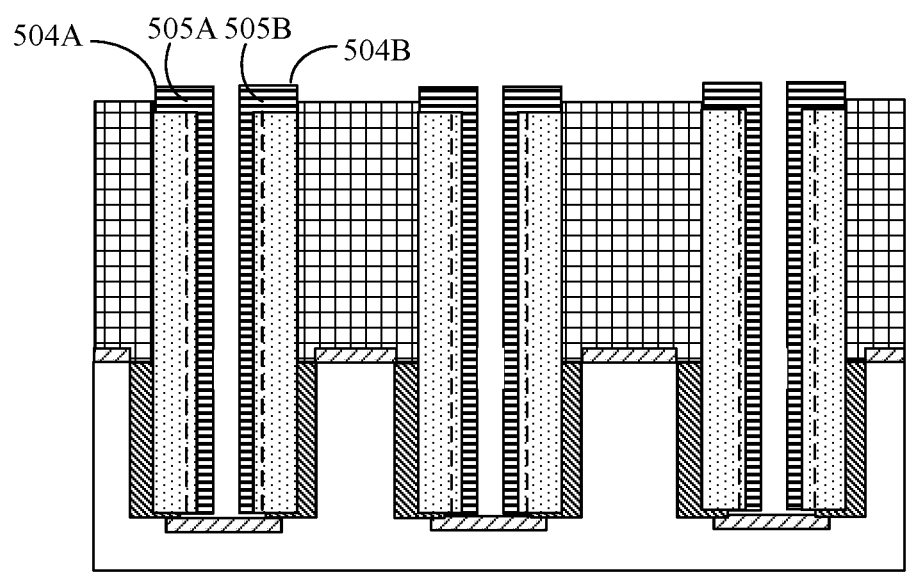
Figure 5M:
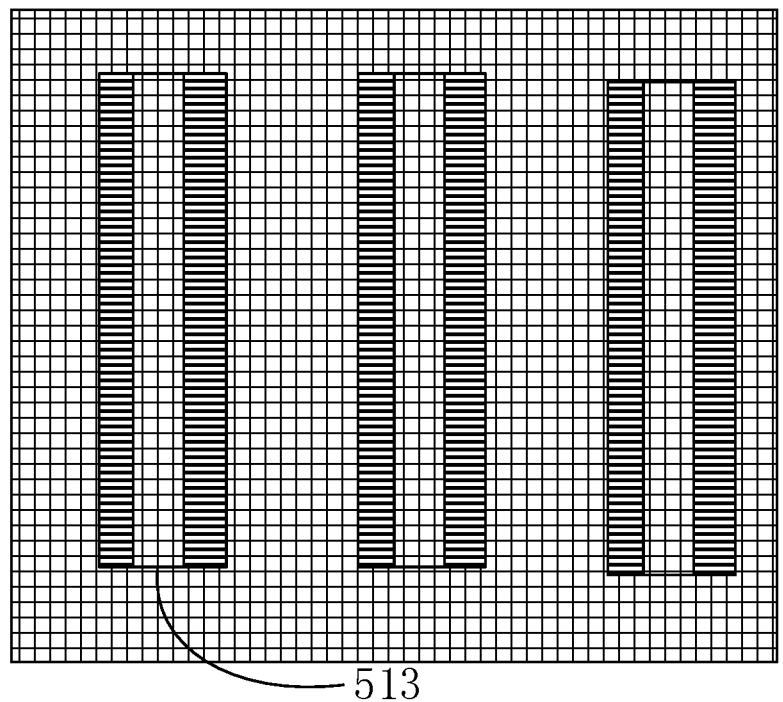
Figure 5M:
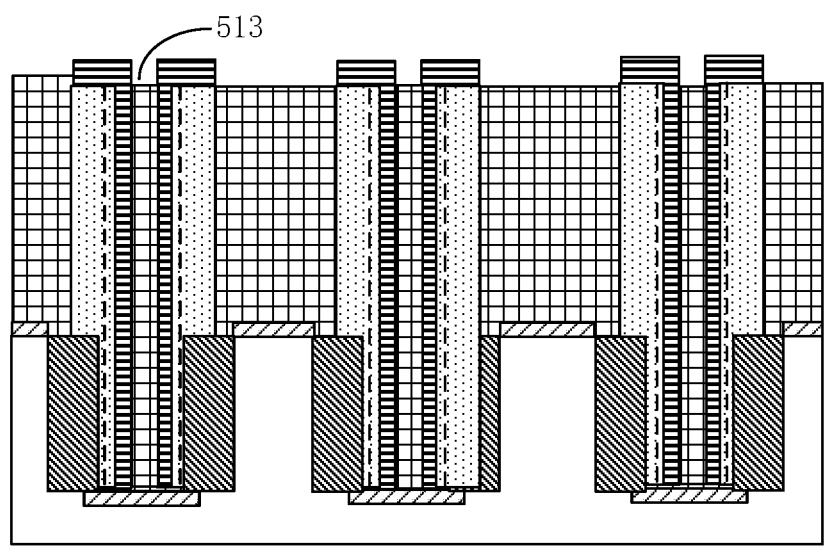
Figure 5N:
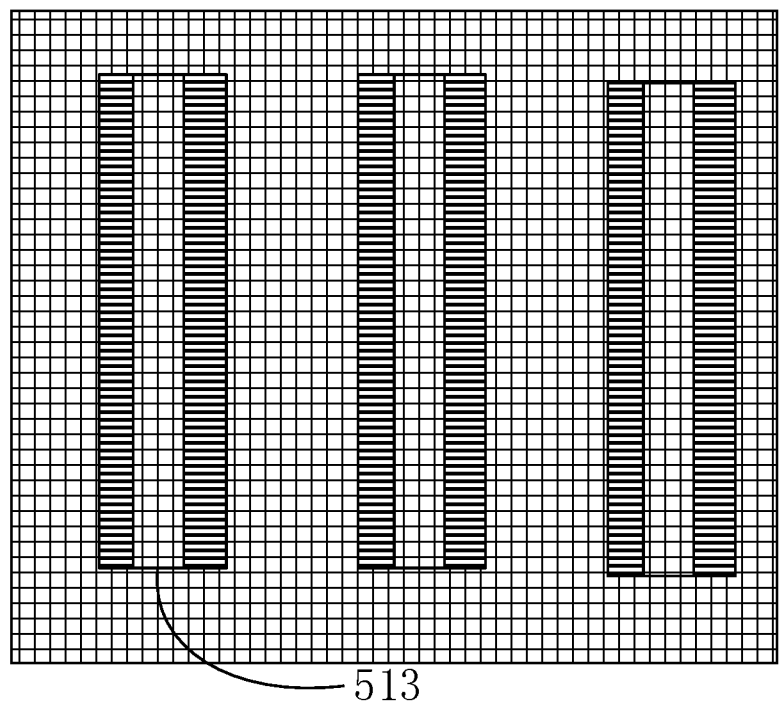
Figure 5N:
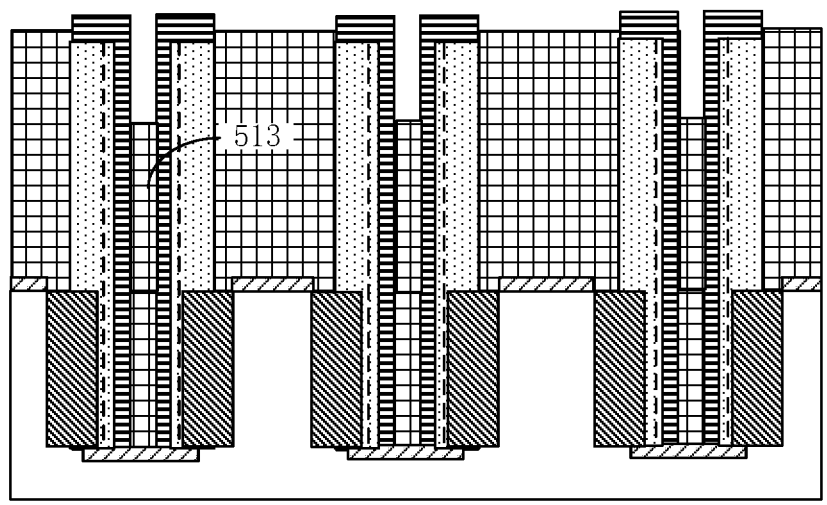
Figure 50A:
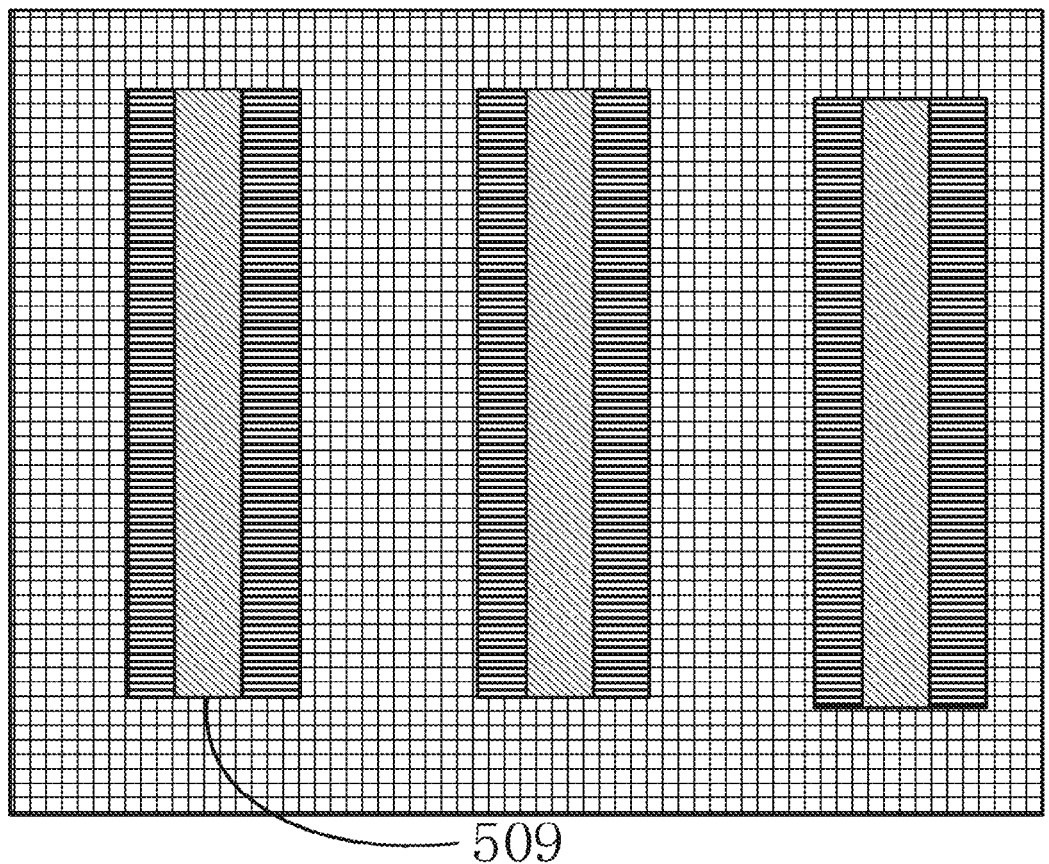
Figure 50B:
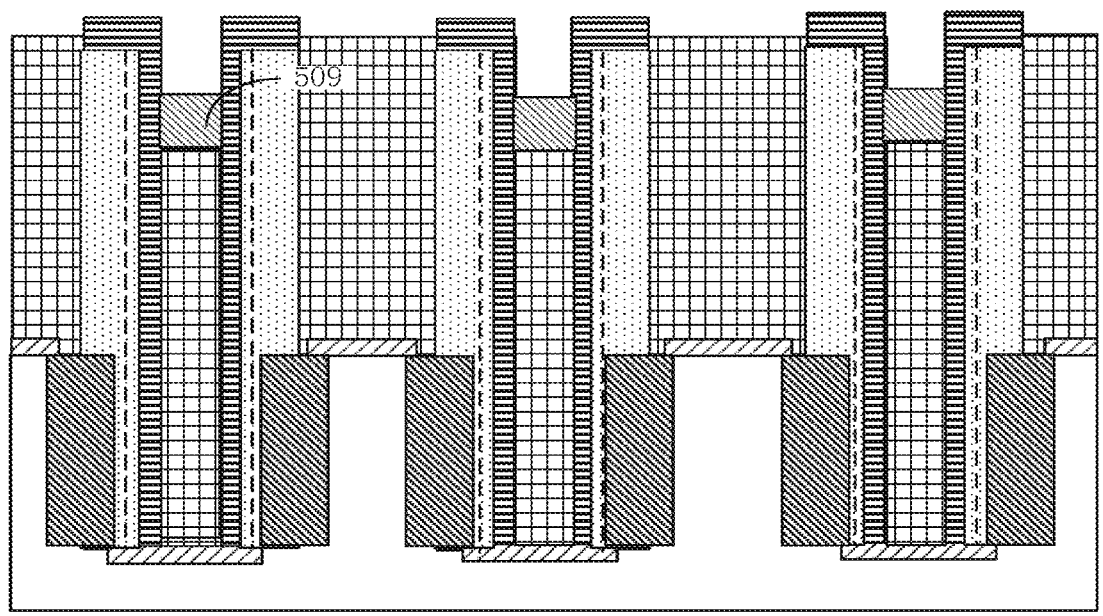
Figure 5P:
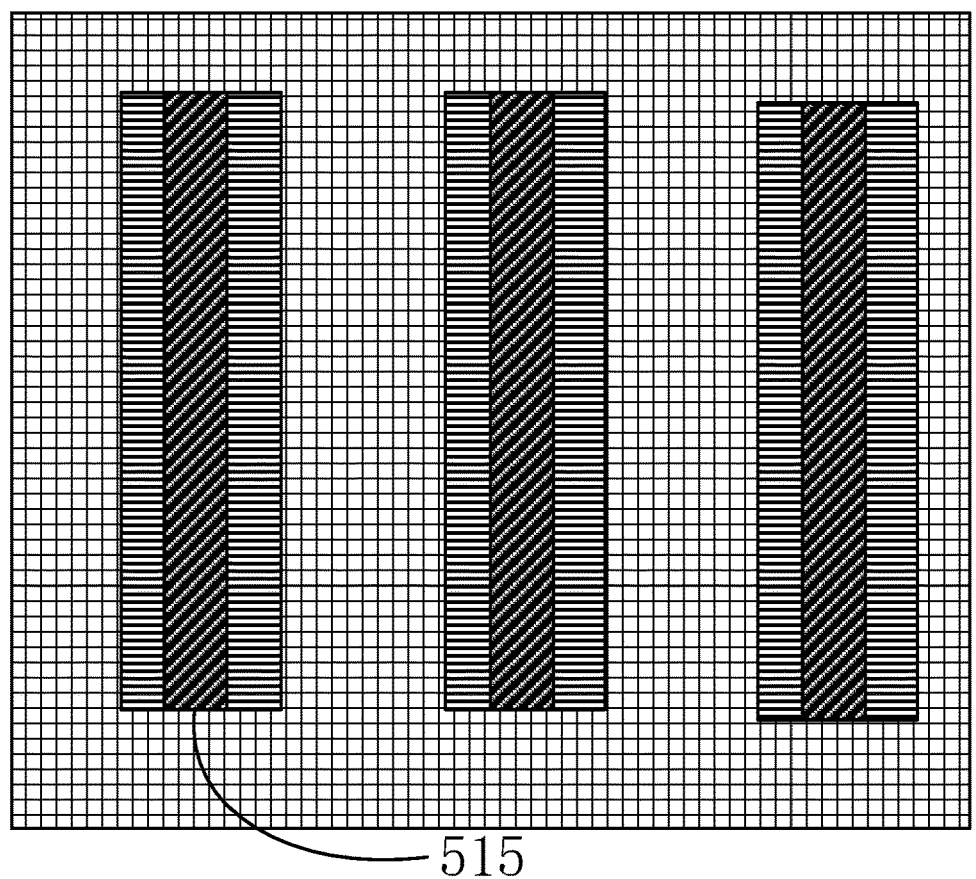
Figure 5P:
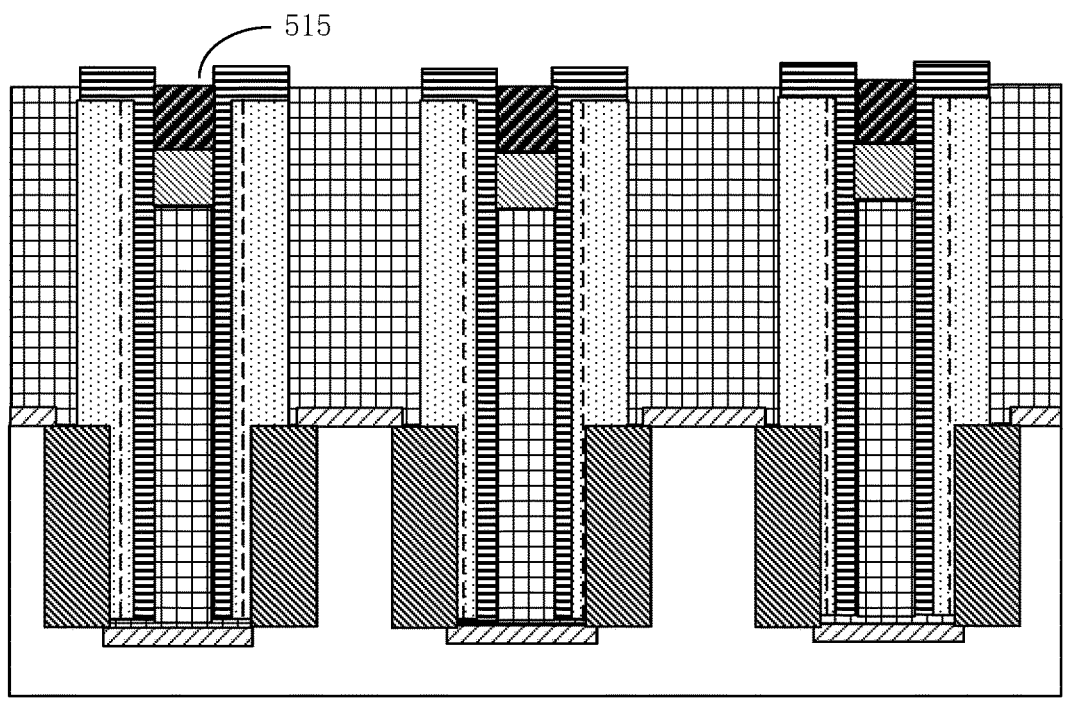
Figure 5Q:
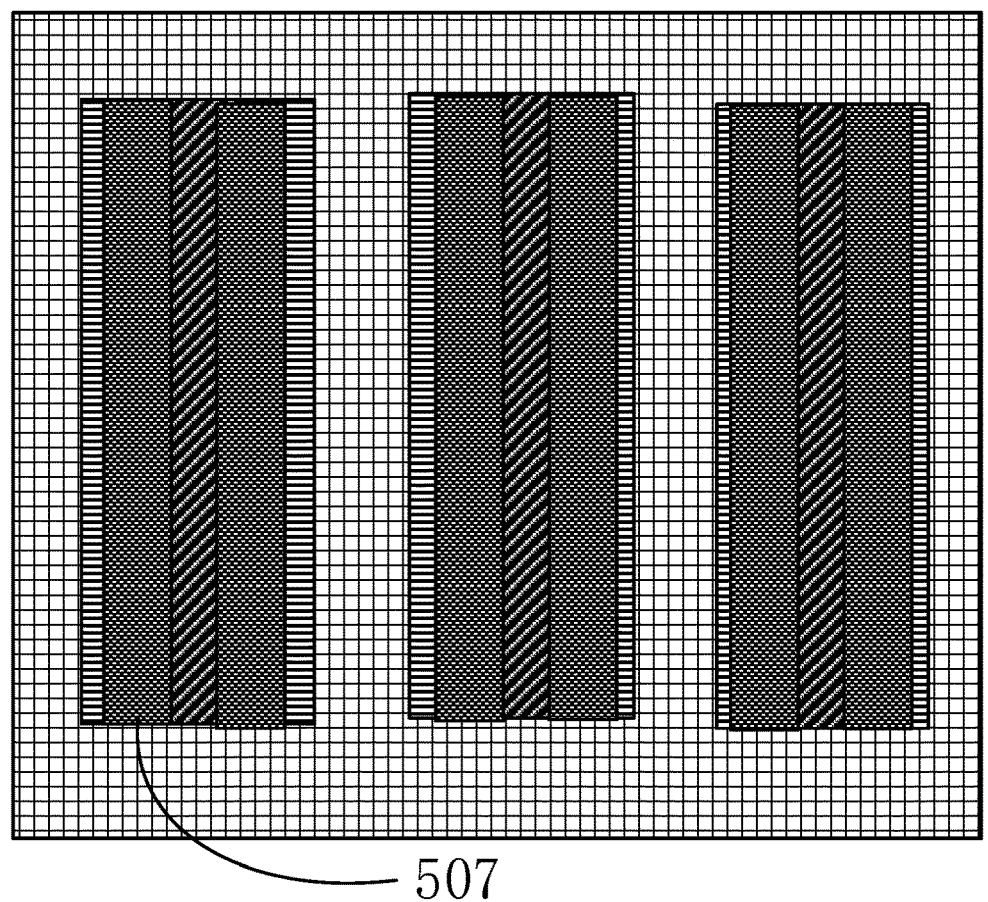
Figure 5Q:
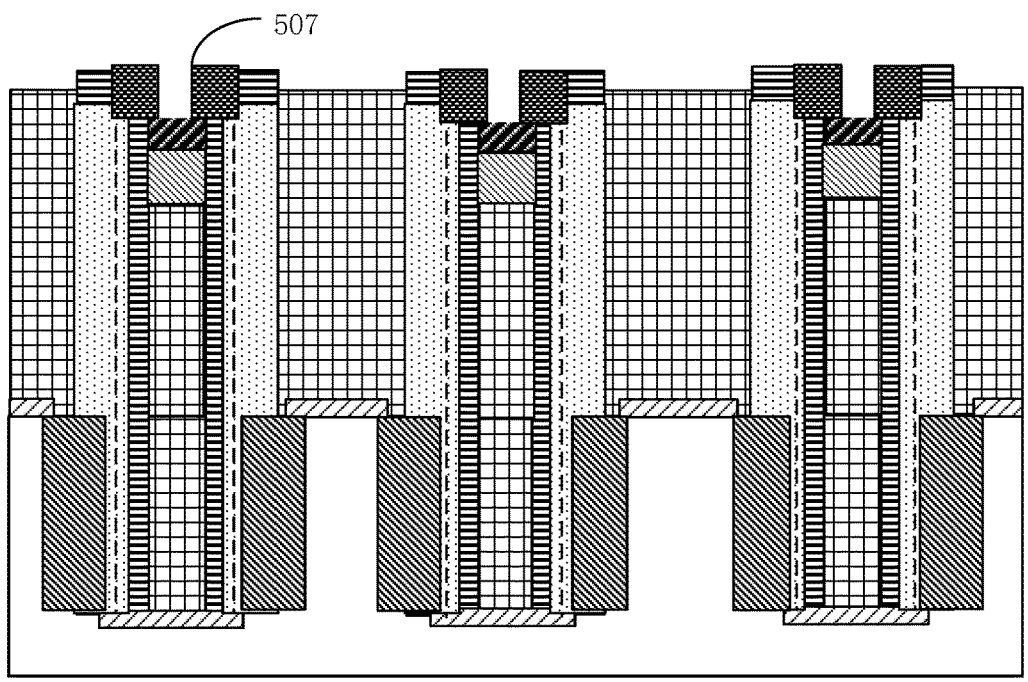
Figure 5R:
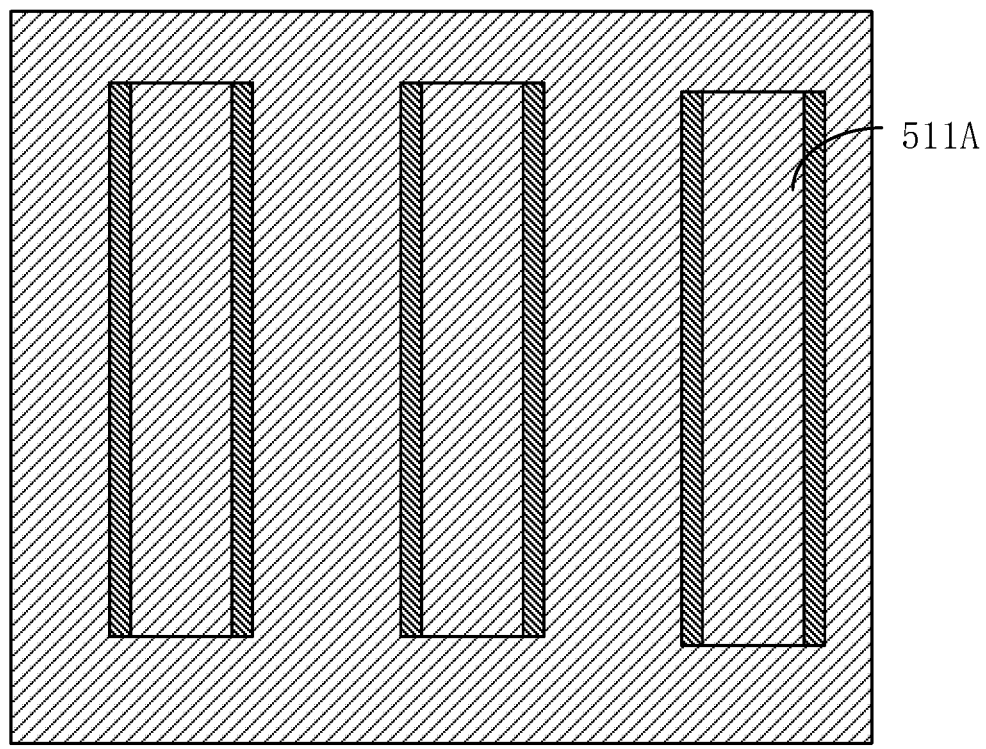
Figure 5R:
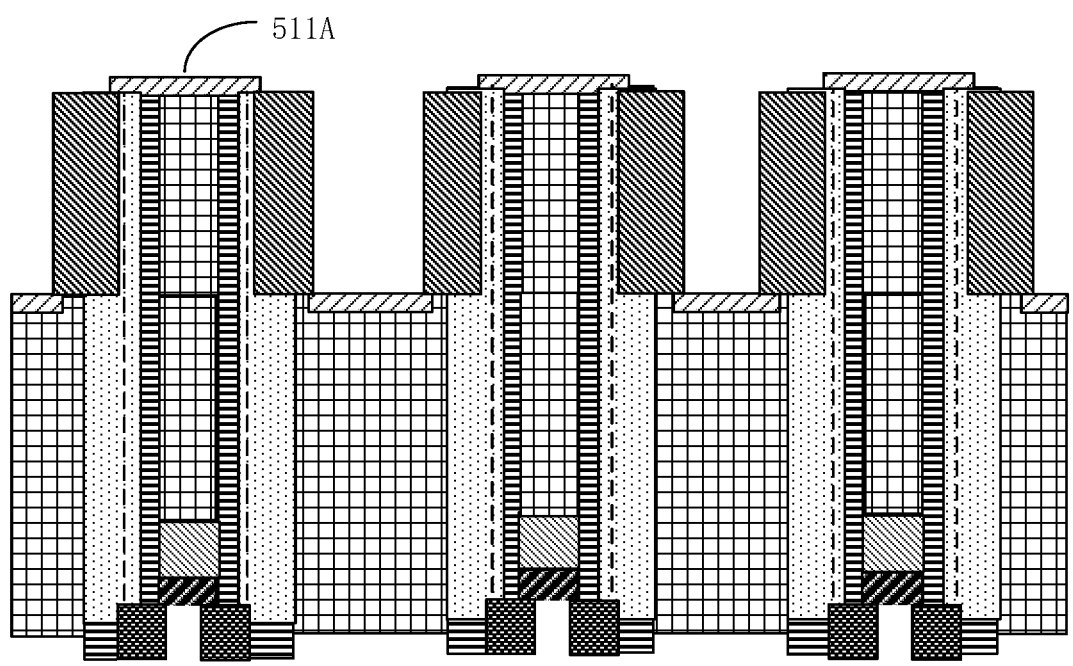
Figure 5S:
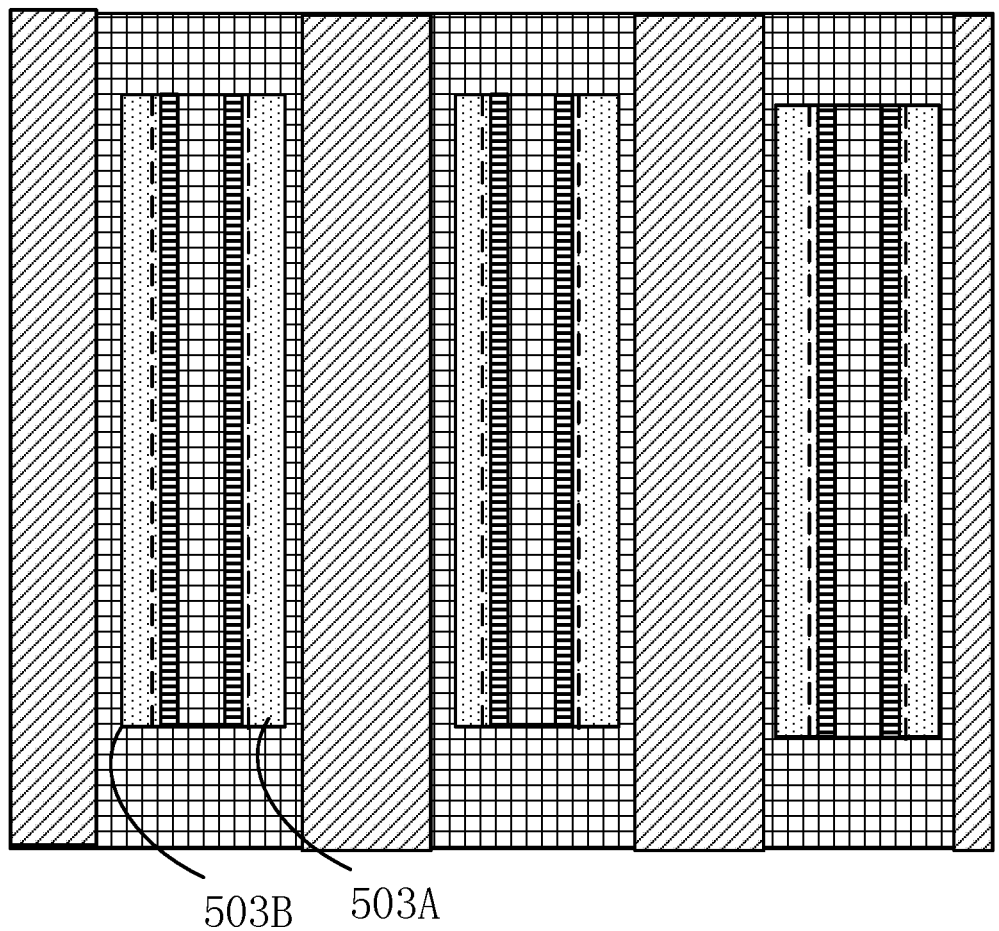
Figure 5S:
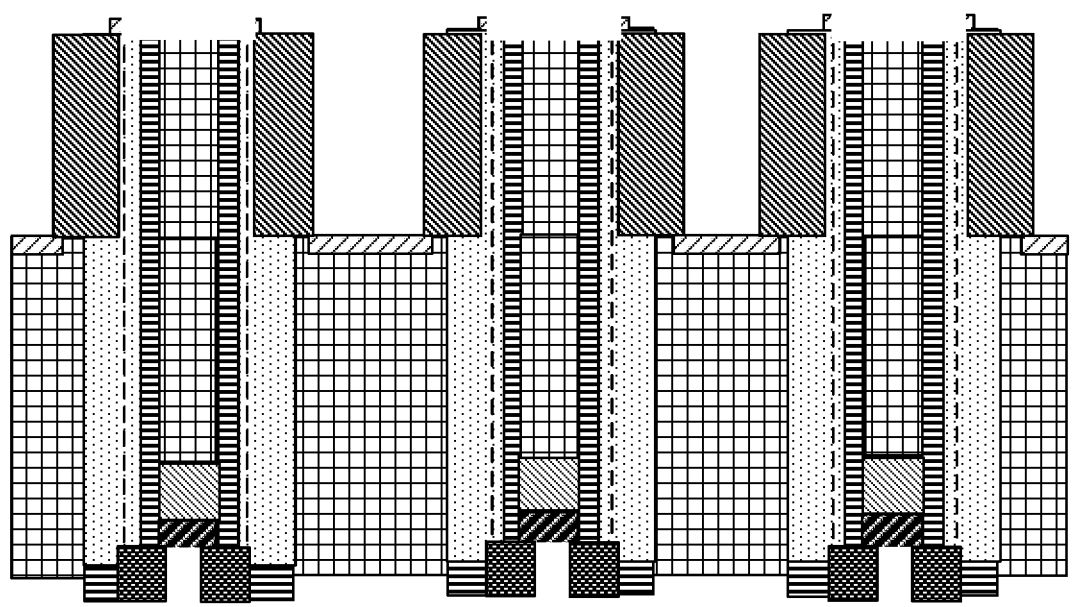
Figure 5T:
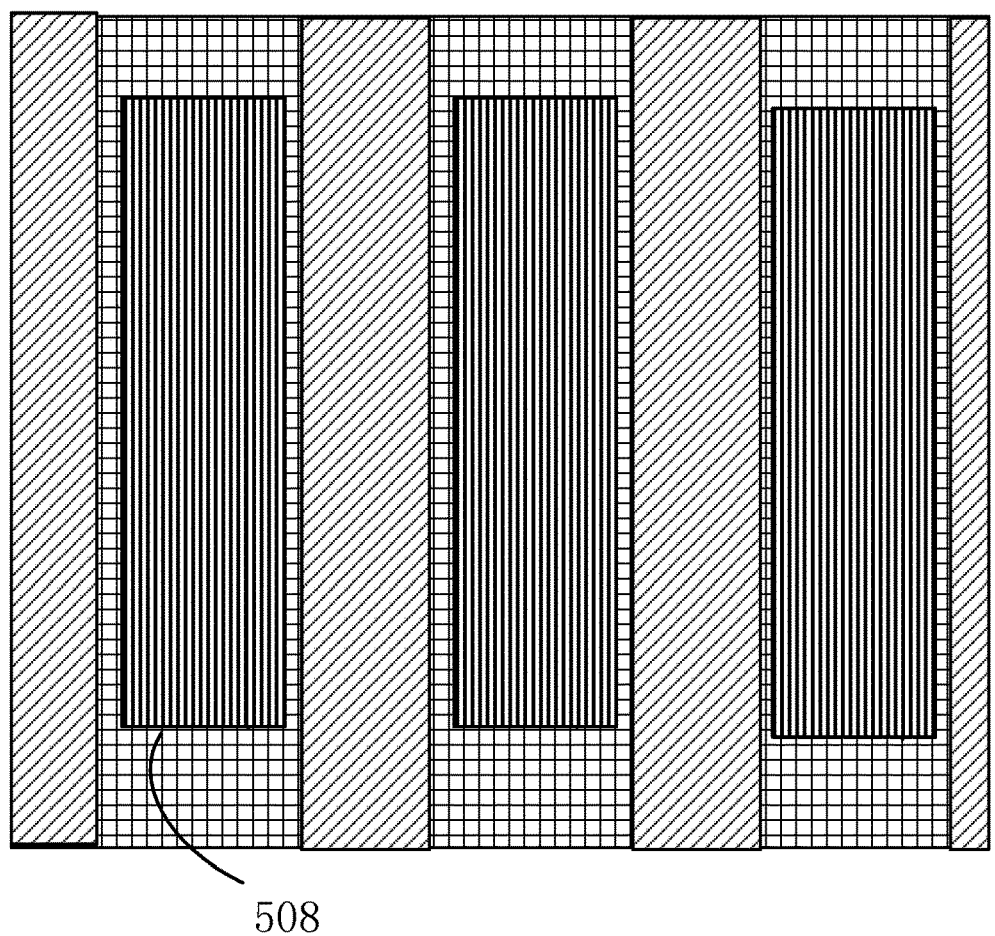
Figure 5T:
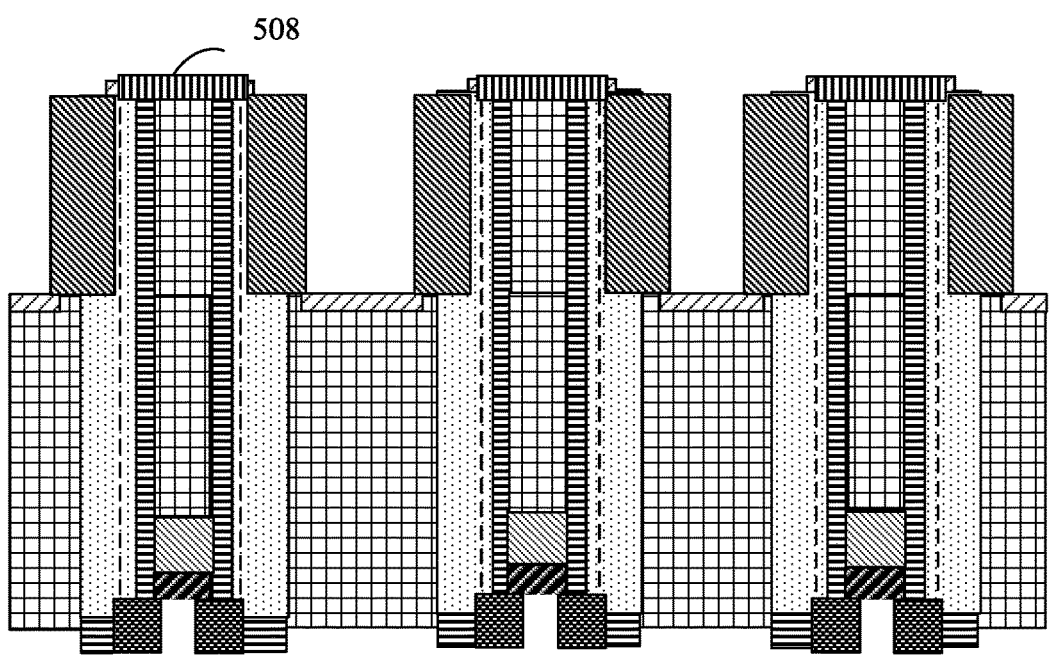
Figure 5U:
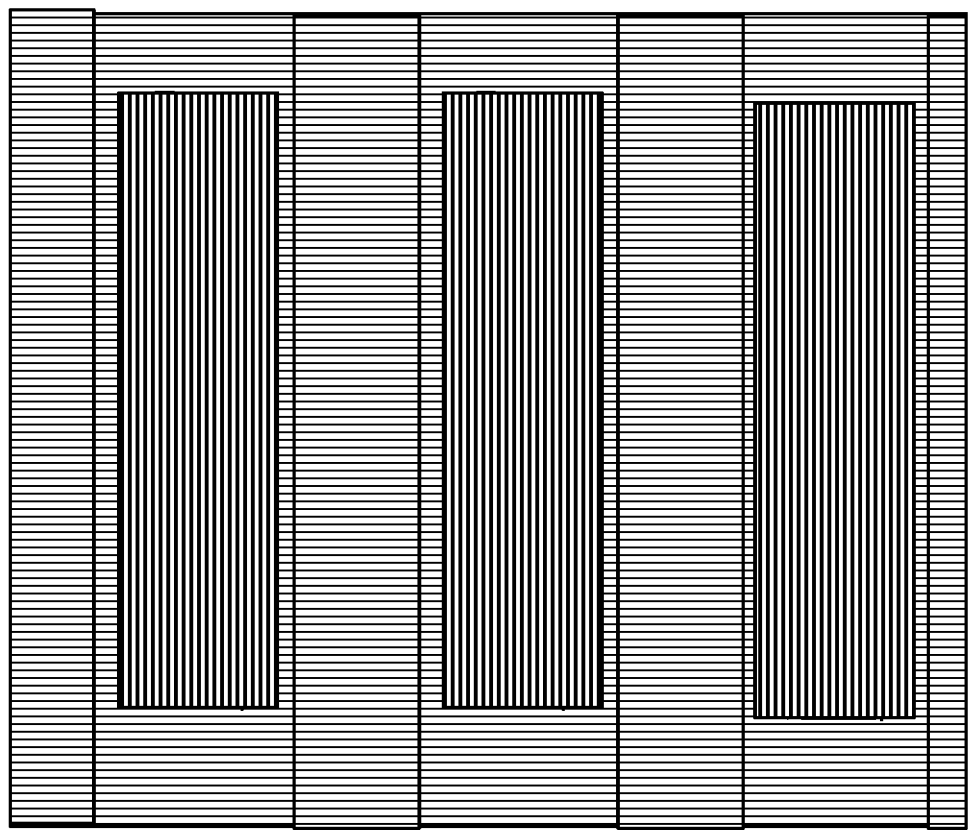
Figure 5U:
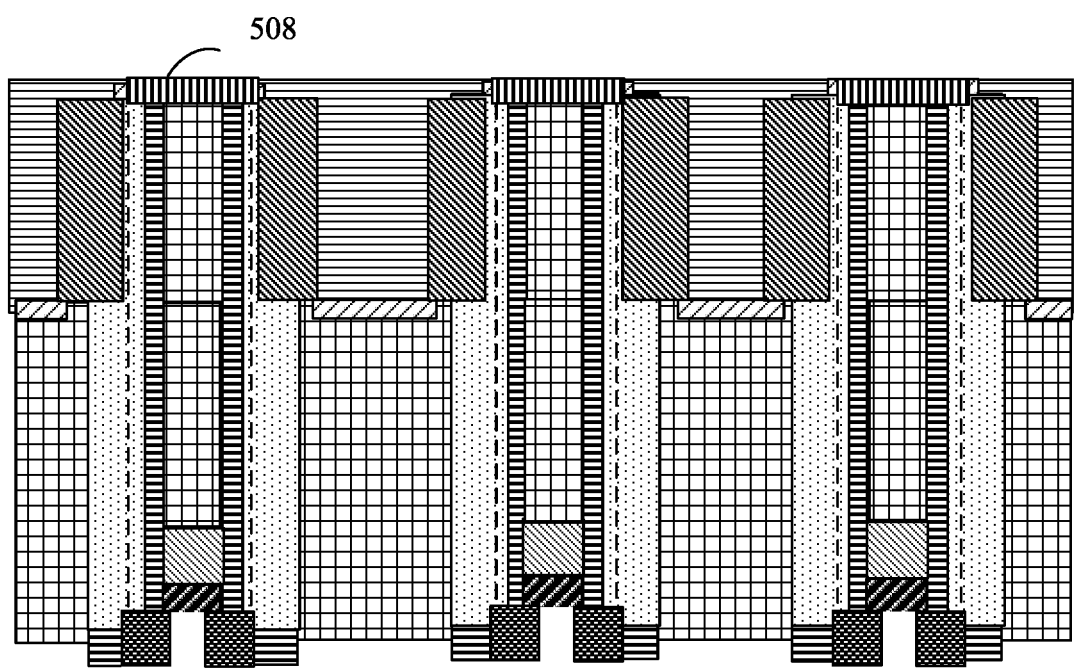
Figure 5V:
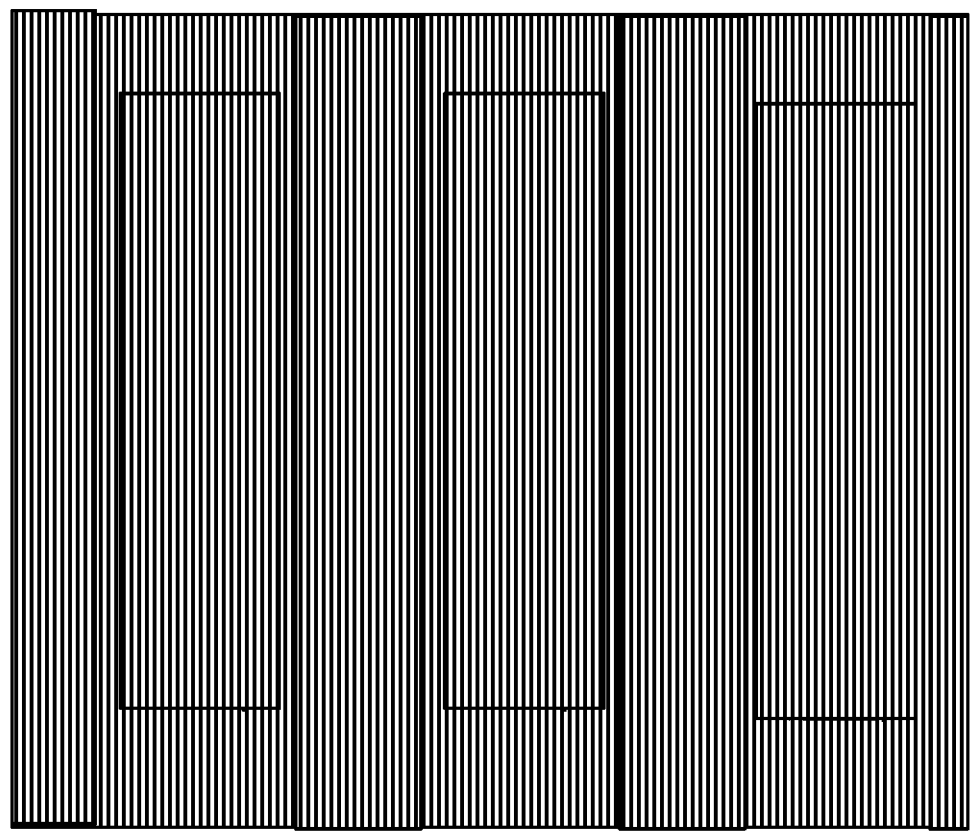
Figure 5V:
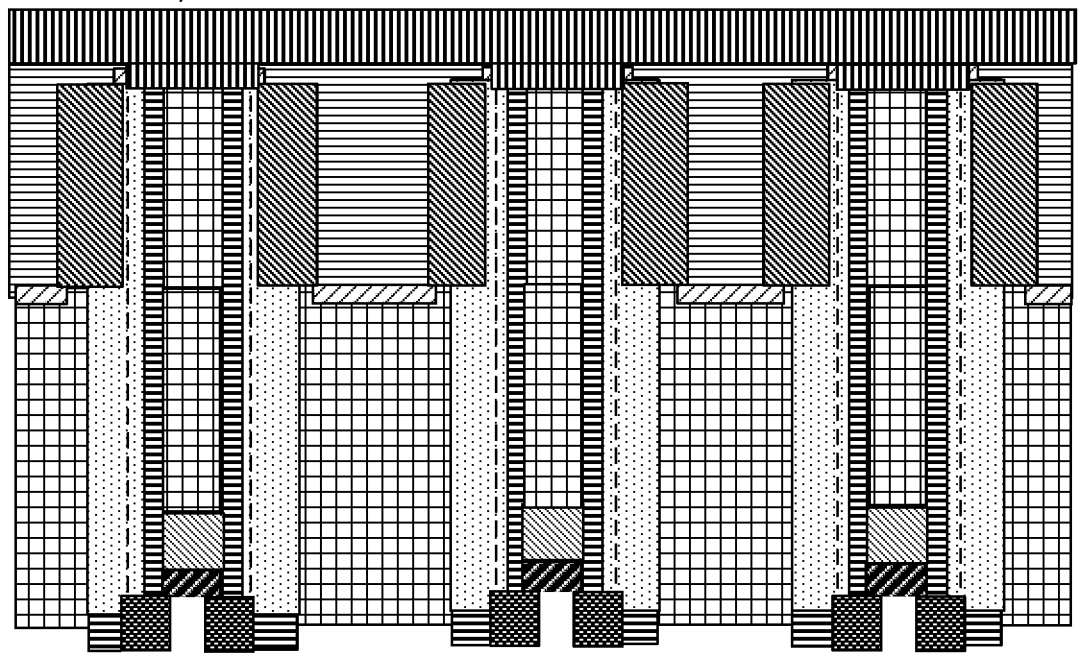

FIG. 5AA-FIG 5VB are flow charts of a manufacturing method of a high electron mobility transistor HEMT according to an embodiment of the present disclosure; FIG. 5AA-FIG. 5VA are top views of each step of a HEMT manufacturing method according to an embodiment of the present disclosure, and FIG. 5AB-FIG 5VB are cross-sectional views of each step of a HEMT manufacturing method according to an embodiment of the present disclosure. In this embodiment, a semiconductor device is fabricated on a silicon substrate. As understood by those skilled in the art, other substrates such as intrinsic GaN, $Al_2O_3$ (sapphire), SiC, etc. can also realize similar structures.

As shown in the figure, the preparation method 500 of HEMT includes: in step is 5001, as shown in FIGS. 5AA and 5AB, a Si substrate 501 is provided.

In step 5002, a plurality of first holes are formed on the substrate, as shown in FIGS. 5BA and 5BB. For example, the substrate 501 is etched by photolithography, and a plurality of rectangular first holes 521 are formed on the substrate 501 to expose the vertical interfaces 541 and 542 of the substrate 501; wherein, the substrate vertical interfaces 541 and 542 in the first hole 521 are (111) planes of the Si substrate. There are other ways to obtain the first hole 521 in the art, and these methods can also be applied to this.

In some embodiments, the number of the first holes provided on the same substrate depends on the specific requirements of integration and pressure resistance. Here, only three holes are taken as an example. The method according to the present disclosure can pre configure the shape and size of the hole according to the actual needs. For example, when forming a semiconductor device with high withstand voltage, the hole depth is also deep.

In step 5003, a protective layer 531 is formed on the substrate and the first hole surface on the substrate, as shown in FIGS. 5CA and 5CB. A SiN protective layer 531 is grown on the substrate 501 using a technique such as LPCVD to cover the surfaces of the substrate 501 and the plurality of holes 521.

In step 5004, the protective layer 531 horizontally extending on the bottom surface of the first hole and the upper surface of the substrate is removed, and the protective layer 531 on the sidewall of the first hole is retained, as shown in FIGS. 5DA and 5DB. The Si substrate 501 on the bottom surface of the hole 521 is exposed by the etching technique having the vertical orientation, leaving only the protective layer 531 formed of SiN on the vertical interfaces 541 and 542. The protective layer 531 covers the substrate vertical interfaces 541 and 542 of the substrate hole 521.

In step 5005, a first spacer layer is formed on the substrate and the first hole, as shown in FIGS. 5EA and 5EB. The partition layer 511 is covered on the bottom surface of the first hole 521. In some embodiments, $SiO_2$ may be formed using a deposition technique to form the first spacer layer 515 on the substrate 501. Since the vertical interfaces 541 and 542 of the substrate 501 are covered with the protective layer 531, the vertical interfaces 541 and 542 of the substrate 501 are substantially free of the growth separation layer 515.

In step 5006, the protective layer of the hole sidewall is removed, as shown in FIGS. 5FA and 5FB. The spacer layer 511 over the substrate 501 covers a mask, and the protective layer 531 on the sidewall of the first hole 521 is partially etched by a selective etching technique. For example, etching may include removing a portion of the sidewall of the first hole 521. After etching, the vertical interfaces 541 and 542 of the substrate 501 are exposed. There are other methods in the art to remove the protective layer and expose the vertical interface of the substrate. These methods can also be applied to this.

In step 5007, a first nucleation layer and a second nucleation layer are formed at the vertical interface, as shown in FIGS. 5GA and 5GB. The first and second nucleation layers 502A and 502B are grown on the exposed vertical surfaces 541 and 542 of the substrate 501. The nucleation layers 502A and 502B include AlN. In some embodiments, after forming AlN, one or more buffer materials of AlN, GaN, AlGaN, InGaN, AlInN, and AlGaInN may be further grown. In some embodiments, the nucleation layer may grow in the vertical direction (not shown) while growing horizontally. Through the control of process parameters, the growth of nucleation layer can be made as horizontal as possible. Moreover, although there is growth in the vertical direction, it does not affect the device structure.

In step 5008, a shielding layer is formed on the entire surface of the device, as shown in FIGS. 5HA and 5HB. On the structure shown in FIGS. 5GA and 5GB, the $SiO_2$ shielding layer 512 is formed by a deposition process. The shielding layer 512 fills the hole 521 and forms a $SiO_2$ shielding layer 512 of a certain height on the substrate. In some embodiments, if it is desired to form a semiconductor device with a large aspect ratio, the height of the shielding layer 512 will be correspondingly increased.

In step 5009, the shielding layer is patterned to form a plurality of second holes, as shown in FIGS. 5IA and 5IB. The vertical second holes 523 and 524 are etched on the shield layer 512 by a vertical etching technique. Basically, the second holes 523 and 524 define the height of the second layer of the semiconductor device and limit the height of the nucleation layer to the first layer. At the bottom of the holes 523 and 524, the upper surfaces and side surfaces of the nucleation layers 502A and 502B are exposed.

Those skilled in the art should note that the nucleation layers 502A and 502B are formed on the surface of the Si substrate (111), so the nucleation layers 502A and 502B have hexagonal symmetry. Other structures formed in the holes 523 and 524 also have hexagonal symmetry after exposing the upper surfaces and side surfaces of the nucleation layers 502A and 502B.

In step 5010, the first and second channel layers are grown in the plurality of second holes, as shown in FIGS. 5JA and 5JB. Channel layers 503A and 503B are formed on the nucleation layer 502 by epitaxial growth. For traditional epitaxial growth, the horizontal growth is not easy to control, so it is difficult for the semiconductor structure to maintain completely vertical growth, and multiple growth planes may appear. The structure of the invention can maintain the continuous growth of the same surface and improve the electrical characteristics of the device.

In step 5011, a third hole is formed between the first channel layer and the second channel layer, as shown in FIGS. 5KA and 5KB. In some embodiments, the shield layer 512 between the nucleation layers 503A and 503B is etched to form the third hole 525. Since the third hole 525 is formed between the two second holes 523 and 524, it can be considered that the third hole 545 and the second holes 523 and 524 together form a larger hole with the shielding layer as the sidewall.

In step 5012, in the third hole, a first barrier layer and a second barrier layer are formed on one side of the first channel layer and the second channel layer, respectively, as shown in FIGS. 5LA and 5LB. Barrier layers 504A and 504B are formed by epitaxial growth in the third hole 525. In some embodiments, a barrier layer may be grown to fill the third hole 525, and then the barrier layers 504A and 504B may be formed by etching the barrier layers 504A and 504B. In some embodiments, the barrier layer may be the same height as the channel layer. In the preferred embodiment, in order to save the process and avoid unnecessary etching from damaging the crystal structure, two barrier layers are epitaxially grown from the channel layers on both sides of the third hole 525 to reserve the space between the two barrier layers. Thus, as shown in the figure, part of the barrier layer is also formed on the upper surface of the channel layer.

In step 5013, a second spacer layer is formed on the entire device, as shown in FIGS. 5MA and 5MB. $SiO_2$ is deposited on the semiconductor device by a deposition process to fill the space between the barrier layers 504A and 504B and partially cover the channel layer and the barrier layer to form the second spacer layer 513.

In step 5014, the second spacer layer is patterned, and part of the second spacer layer between the first barrier layer 504a and the second barrier layer 504b is removed, as shown in FIGS. 5NA and 5NB. A portion of the second partition layer 513 between the barrier layers 504A and 504B is partially removed by a vertical etching technique.

In step 5015, a third electrode is formed between the first barrier layer and the second barrier layer, as shown in FIGS. 5OA and 5OB. The third electrode 509 is formed on the separation layer 513 remaining between the first and second barrier layers by an electrode deposition method. In some embodiments, the electrode 509 as a gate is arranged closer to the upper position, and the electrode 509 as a gate is as far away from the second electrode 508 (drain) as possible to improve the overall voltage resistance of the device.

In step 5016, a third spacer layer is formed on the third electrode, as shown in FIGS. 5PA and 5PB. $SiO_2$ is deposited on the third electrode 509 by a deposition process to fill the space between the first barrier layer and the second barrier layer above the third electrode 509 to form the third partition layer 515.

In step 5017, the upper surfaces of the first and second heterojunctions are exposed, and a first electrode 507 is formed on the first and second heterojunctions, as shown in FIGS. 5QA and 5QB. As shown in the figure, the upper surfaces of the first and second heterojunctions are exposed by removing the second partition layer above the first and second heterojunctions and the possible horizontally extending first and second barrier layers by patterning. In some embodiments, portions of the first and second channel layers and the first and second barrier layers may be further removed to ensure good electrical contact. Next, the first electrode 507 is formed by filling the electrode material. Although the first electrode 507 shown in the figure includes two parts respectively contacting the first heterojunction and the second heterojunction, these two parts are electrically connected to the same interconnection layer, and thus can be considered as the same electrode.

In some embodiments, the subsequent steps include forming the first conductor interconnection layer and the third conductor interconnection layer and electrically connecting them to the first electrode and the third electrode, respectively. These steps are well known to those skilled in the art and will not be described here.

In step 5018, the entire semiconductor device is turned over and the substrate 501 is removed, as shown in FIGS. 5RA and 5RB. As shown in the figure, after the semiconductor device is turned over, the substrate 501 faces upward. The substrate 501 is first thinned, and then the entire substrate 501 is removed from the semiconductor device by wet etching.

In step 5019, the first heterojunction and the second heterojunction are exposed, as shown in FIG. 5SA and FIG. 5SB. As shown in the figure, after the substrate 501 is removed, the spacer layer above the first and second heterojunctions and part of the insulating material between them are removed to expose the first and second heterojunctions. In some embodiments, over etching may be appropriately performed to ensure good electrical contact.

In step 5020, the second electrode 508 is formed, as shown in FIG. 5TA and FIG. 5TB. As shown in the figure, a metal electrode, i.e., a second electrode 508, is formed on the first heterojunction and the second heterojunction by depositing metal. The second electrode 508 is in electrical contact with the vertical 2 DEG in both the first heterojunction and the second heterojunction.

In step 5021, a passivation layer is formed, and then part of the passivation layer is etched to expose the second electrode 508, as shown in FIGS. 5UA and 5UB. As shown in the figure, a passivation layer is formed by depositing $SiO_2$ to fill the space between each HEMT. Of course, $SiO_2$ is also partially deposited on the second electrode 508. Then, $SiO_2$ on the second electrode 508 is removed by an etching technique to expose the second electrode.

In step 5022, a second conductor interconnection layer is formed, as shown in FIG. 5VA and FIG. 5VB. As shown in the figure, a second conductor interconnection layer is formed by depositing metal to electrically connect the plurality of electrodes 508. In some embodiments, the electrode of the second electrode 508 and the second conductor interconnection layer may be the same material. In some embodiments, the step of forming the second conductor interconnection layer is not necessary. In step 5020, the second electrode 508 and the second conductor interconnection layer may be formed simultaneously.

In the embodiment shown in FIG. 5, the shapes of the first and second channel layers 503A and 503B and the first and second barrier layers 504A and 504B are defined by holes. As mentioned above, such a structure has many advantages. In some embodiments, the first and second channel layers 503A and 503B and the first and second barrier layers 504A and 504B may not be defined by holes, but the epitaxial growth of the first and second channel layers and the first and second barrier layers may be controlled by adjusting process parameters.

Those skilled in the art should note that the embodiment described in FIGS. 5AA-5VB is only an exemplary method for manufacturing the semiconductor device according to the present disclosure. There are other manufacturing processes and methods in the art, which can also be applied to obtain the semiconductor device of the present disclosure. These methods are also within the scope of the present disclosure.

As understood by those skilled in the art, the height of the vertical channel semiconductor device formed on the substrate of the present disclosure is generally limited. The height of the semiconductor device is small compared to the height of the substrate. For example, the height of the substrate is generally more than 500 microns, while the height of the semiconductor device is generally several to several tens of microns. A problem caused by this is that the semiconductor device itself is thin, the mechanical strength is insufficient, the self-supporting force is weak, and it is easy to be damaged in the process of removing the substrate.

In order to solve this problem, the prior art method is to fix the wafer including the substrate and the semiconductor device on a temporary substrate before removing the substrate. After removing the substrate and forming the second electrode and the second conductor interconnection layer, the temporary substrate is removed. When using the temporary substrate, the mechanical strength of the semiconductor device can be improved by thickening the metal of the conductor interconnection layer, and the semiconductor device itself can have better self-supporting ability after completing the process.

However, the method steps of the prior art are cumbersome and the cost is high. The present disclosure provides a process that can achieve better support strength and complete the process without temporary substrate.

Figure 6A:
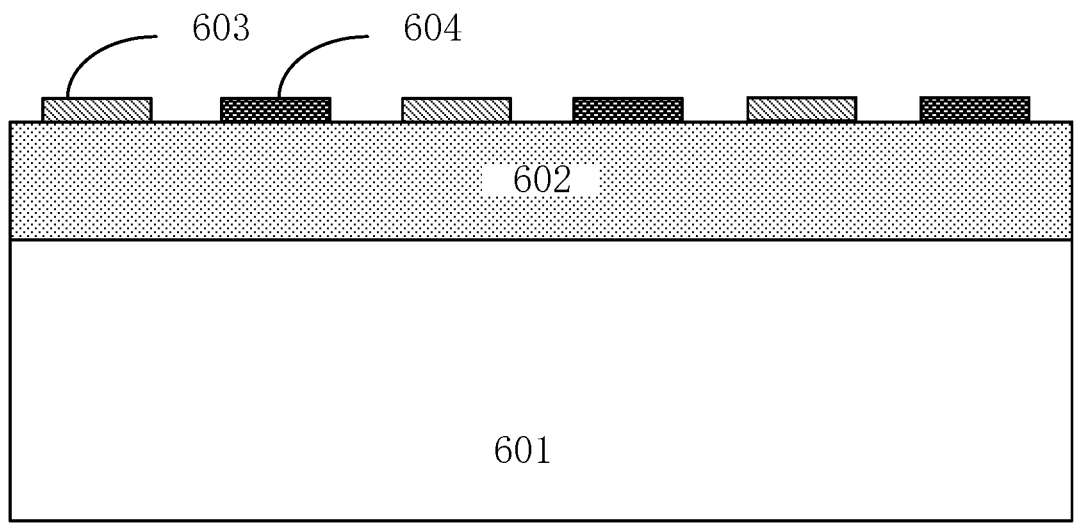
FIGS. 6A-6G are flowcharts of a method of fabricating a semiconductor device according to one embodiment of the present disclosure.

FIGS. 6A-6G are flowcharts of a semiconductor device fabricating method according to one embodiment of the present disclosure. FIG. 6A shows a state of a semiconductor device (i.e., a wafer) before substrate removal. As shown in the figure, the wafer includes a substrate 601 and a semiconductor device layer 602 above it. The semiconductor device layer 602 includes the vertical channel semiconductor device of the present disclosure, including, but not limited to, one or more of Schottky diode, HEMTs, and HHMTs. A plurality of first conductor interconnection layers 603 (e.g., source interconnection layers) and a plurality of third conductor interconnection layers 604 (e.g. gate interconnect layers) are included over the semiconductor device layer 602. As understood by those skilled in the art, the semiconductor device layer 602 can be realized using the above described method or other methods in the art, and will not be described here.

Figure 6B:
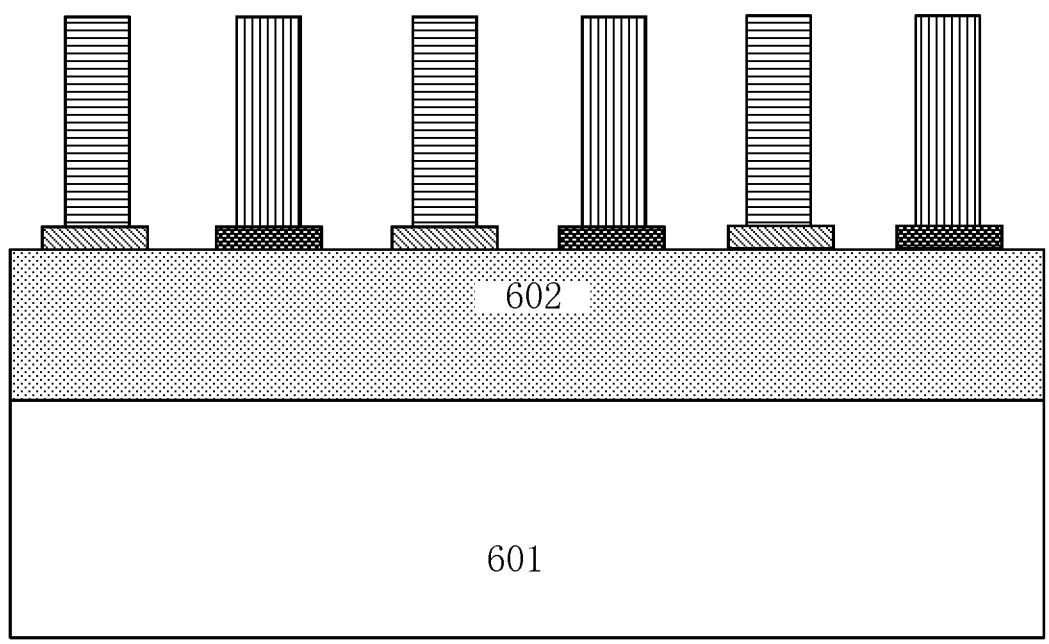

The substrate removal method of this embodiment includes the following steps: in step 610, a plurality of metal pillars, such as copper pillars, are formed on the plurality of first electrode interconnection layers 603 and the plurality of third electrode interconnection layers 604; as shown in FIG. 6B. A plurality of metal pillars are formed on each electrode interconnection layer and electrically connected to each electrode interconnection layer. The height of the metal column is high to provide sufficient supporting force in subsequent steps. In some embodiments, the height of the metal pillar is greater than 50 microns, 80 microns, or 100 microns.

In some embodiments, if the semiconductor device layer is a device such as a Schottky diode, the third electrode interconnection layer 604 does not appear on the semiconductor device. Therefore, the third electrode interconnection layer 604 is not necessary.

Figure 6C:
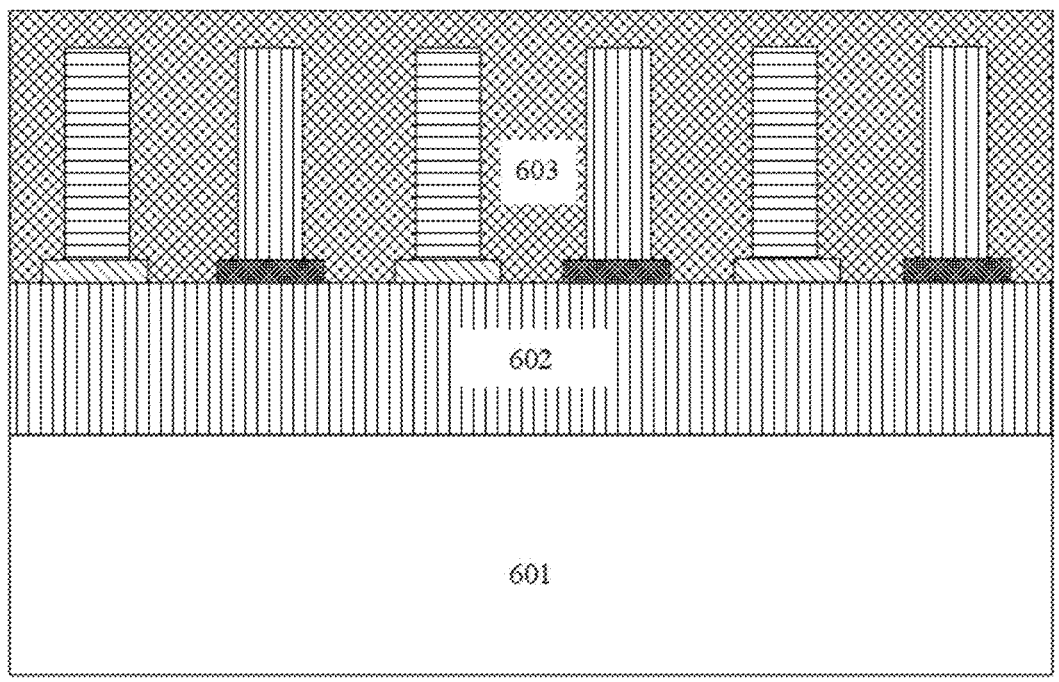

In step 620, an insulating material is injected between the plurality of metal columns by an injection molding process, as shown in FIG. 6C. The insulating material includes two states of flow state and condensed state. During the injection molding process, the insulating material is in a flow state, and flows between the metal columns after injection. After a period of time, the insulating material turns into a solid state, which has good mechanical strength and can provide support in the subsequent substrate removal step. In some embodiments, the insulating material includes at least one or more organic materials, such as epoxy resin EP, polystyrene PS, ABS, polycarbonate PC, high density polyethylene HDPE, polypropylene PP, and polyvinyl chloride PVC.

In this embodiment, an injection molding process is adopted. Injection molding process is a traditional process, easy to integrate with semiconductor process, and relatively low cost. In the process of injection molding, the insulating material is heated to become a flow state. However, the temperature of the insulating material does not cause damage to the semiconductor device. After injection molding, the insulating material enters between the plurality of metal columns and is distributed around the plurality of metal columns. The insulating material becomes a solid state as the temperature decreases, which can not only protect the metal column, but also provide sufficient mechanical strength without using a temporary substrate.

It should be understood by those skilled in the art that the state change of insulating material caused by temperature change is only one way. There are other ways in the art to cause phase change of insulating materials, including but not limited to: ultraviolet irradiation, laser curing, chemical reaction, etc. Depending on the characteristics of the semiconductor device, these kinds of insulating materials can also be selected.

Figure 6D:
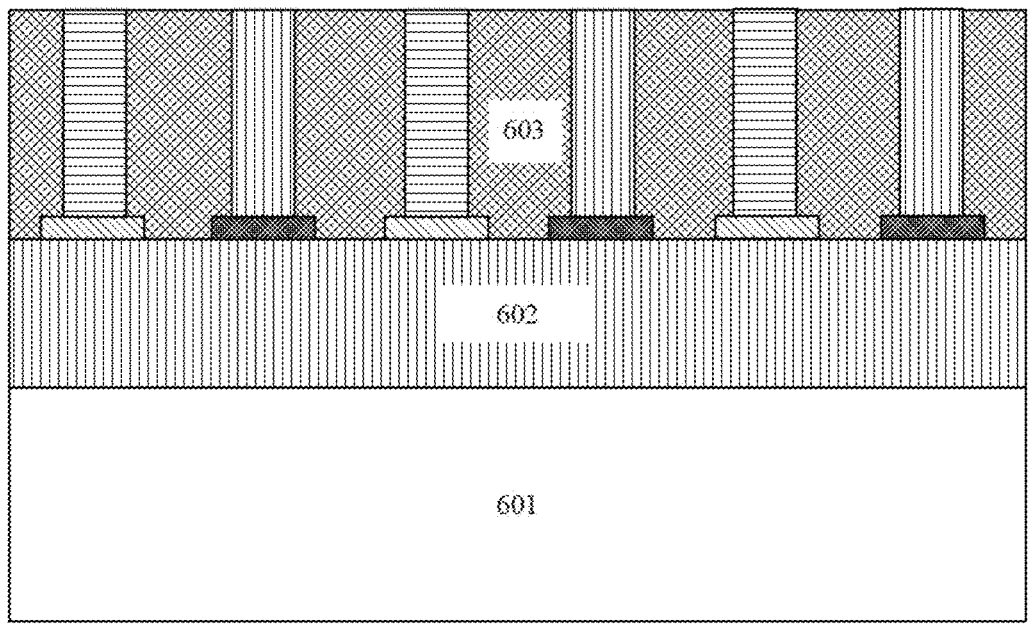

In step 630, part of the insulating material is removed and a plurality of metal pillars are exposed, as shown in FIG. 6D. This step can also be completed in a later step. Exposing a plurality of metal pillars can prepare for subsequent electrical connection. Similarly, for the metal column and insulating material formed on the other side, a similar method can be adopted to remove part of the insulating material and expose the metal column to ensure electrical connection.

Figure 6E:
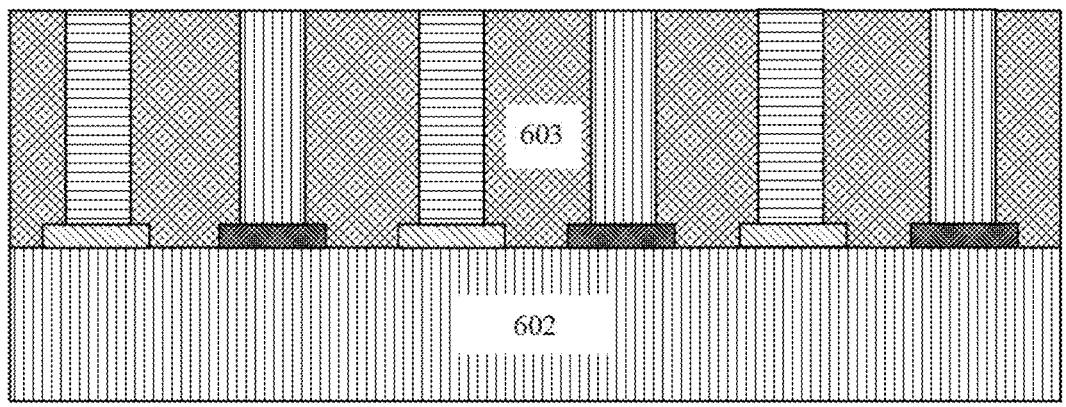

In step 640, the silicon substrate is removed, as shown in FIG. 6E. The wafer still has a good mechanical strength due to the support of a plurality of metal columns and solid insulating materials. The substrate is not easily damaged in the process of removing the substrate. In some embodiments, the entire wafer is turned over and supported in a support device; then the substrate is thinned first, and then the whole substrate is removed by wet etching. In the process of substrate removal, since the insulating material provides sufficient mechanical strength, the entire wafer is supported in the support device without causing damage.

Figure 6F:
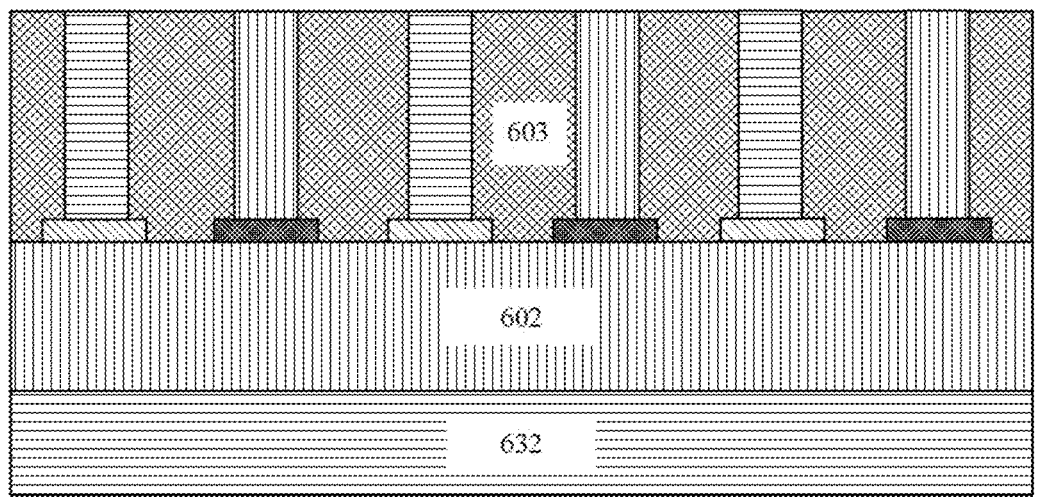

In step 650, a second electrode and a second electrode interconnection layer are formed, as shown in FIG. 6F. Those skilled in the art should note that the formation of the second electrode and the formation of the second electrode interconnection layer can be completed in the same step; or may be completed in different steps. In some embodiments, after the substrate is removed, the second electrode may be formed at an appropriate position of the exposed half electrode device layer 602, thereby forming the second electrode interconnection layer 632 electrically connected to the second electrode. In some embodiments, other steps may be included between forming the second electrode and forming the second electrode interconnection layer. These steps include, but are not limited to, depositing an insulating material such as $SiO_2$ to form a passivation layer.

In some embodiments, the wafer can be cut after step 650. After the semiconductor device layer is cut, one or more semiconductor devices are separated. Next, a packaging step may also be included to obtain a semiconductor device capable of practical application.

Figure 6G:
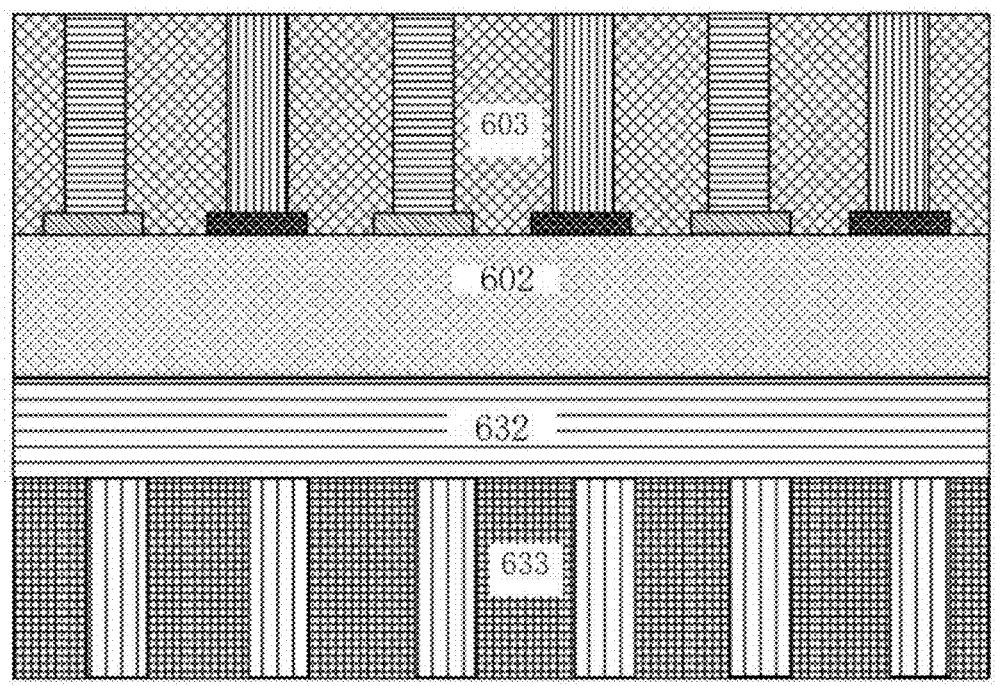

In step 660, a plurality of metal pillars, such as copper pillars, are formed on the second electrode interconnection layer; then, an injection molding process is used to inject insulating materials between the metal columns, as shown in FIG. 6G Similar to steps 610 and 620, a plurality of metal pillars may also be formed on one side of the second electrode and an insulating material may be injected to further improve the physical strength of the half electrode device. At the same time, the insulating material also encloses the entire semiconductor device layer. In some embodiments, subsequent packaging steps can be saved. The wafer can be cut after step 660. In some embodiments, one or more semiconductor devices after dicing may also be packaged again, so as to obtain a semiconductor device that can be applied in practice.

The semiconductor device obtained with reference to FIG. 6G includes a first electrode interconnection layer, a third electrode interconnection layer, and metal pillars each for electrical connection on a first side (upper side); and the insulating material is distributed between the metal pillars to provide the semiconductor device with the required mechanical strength. A second electrode and a second electrode interconnection layer are included on the second side (lower side) of the semiconductor device. Alternatively, the semiconductor device may also include metal pillars for electrically connecting the second electrode interconnection layer and insulating materials distributed between the metal pillars. Thus, additional mechanical strength is provided on the second side of the semiconductor device.

The above embodiments are only for the purpose of explaining the invention, and are not intended to limit the invention. Ordinary technicians in the relevant technical field can also make various changes and modifications without departing from the scope of the invention. Therefore, all equivalent technical solutions should also belong to the scope of the disclosure of the invention.

What is claimed is:

1. A semiconductor device comprising:
   a semiconductor device layer comprising one or more semiconductor devices;
   a first electrode interconnection layer disposed on a first side of the semiconductor device layer;
   one or more first metal pillars disposed on the first side of the semiconductor device layer and electrically connected to the first electrode interconnection layer;
   a first insulating material disposed around the one or more first metal pillars, wherein the first insulating material is an injection moldable material; and
   a second electrode interconnection layer disposed on a second side, opposite to the first side, of the semiconductor device layer,
   wherein one or more semiconductor devices in the semiconductor device layer have vertical channels.

2. The semiconductor device according to claim 1, wherein one or more semiconductor devices in the semiconductor device layer comprise one or more of HEMTs, and HHMTs.

3. The semiconductor device according to claim 1, wherein the second electrode interconnection layer is electrically connected to a second electrode on the second side of the semiconductor device layer.

4. The semiconductor device according to claim 1, wherein the first metal pillars are copper pillars.

5. The semiconductor device according to claim 1, wherein the height of the first metal pillars are greater than 60 microns, greater than 80 microns, or greater than 100 microns.

6. The semiconductor device according to claim 1, wherein the first insulating material is distributed, by injection molding, around the one or more metal pillars.

7. The semiconductor device according to claim 1, wherein the first insulating material is an organic material.

8. The semiconductor device according to claim 1, wherein the first insulating material is one or more of epoxy resin EP, polystyrene PS, ABS, polycarbonate PC, high density polyethylene (HDPE), polypropylene (PP), and polyvinyl chloride (PVC).

9. The semiconductor device according to claim 1, further comprising one or more second metal pillars disposed on the second side of the semiconductor device layer and electrically connected to a second electrode interconnection layer; and a second insulating material disposed around the one or more second metal pillars, wherein the second insulating material is injection molding material.

10. The semiconductor device according to claim 1, further comprising: a third electrode interconnection layer disposed on a first side of the semiconductor device layer; and one or more third metal pillars disposed on the first side of the semiconductor device layer and electrically connected to the third electrode interconnection layer; wherein the first insulating material is also configured to be distributed around the one or more third metal pillars.

11. A semiconductor device obtained by dicing from the semiconductor device according to claim 1.

12. A semiconductor device obtained by dicing and packaging from the semiconductor device of claim 1.

13. A method of manufacturing a semiconductor device, comprising:
   forming one or more first metal pillars on the first electrode interconnection layer on the first side of the semiconductor device layer, wherein one or more semiconductor devices in the semiconductor device layer have vertical channels;
   injecting a first insulating material so that the first insulating material is distributed around the one or more first metal pillars;
   removing the substrate; and
   forming a second electrode interconnection layer on a second side, opposite to the first side, of the semiconductor device layer;
   wherein, the height of the first metal pillar is greater than 60 microns, greater than 80 microns, or greater than 100 microns.

14. The method according to claim 13, further comprising forming a second electrode on the second side, opposite to the first side, of the semiconductor device layer after removing the substrate.

15. The method according to claim 13, further comprising removing part of the first insulating material and exposing the one or more first metal pillars.

16. The method according to claim 13, further comprising forming one or more third metal pillars on the third electrode interconnection layer on the first side of the semiconductor device layer; wherein the step of injecting the first insulating material further comprises distributing the first insulating material around the one or more third metal pillars.

17. The method according to claim 13, further comprising forming one or more second metal pillars on the second electrode interconnection layer on the second side of the semiconductor device layer; injecting a second insulating material such that the insulating material is distributed around the one or more second metal pillars.

18. A method of manufacturing a semiconductor device, comprising: forming a semiconductor device layer on a substrate including one or more semiconductor devices, wherein one or more semiconductor devices in the semiconductor device layer have vertical channels;
   forming a first electrode interconnection layer on a first side of the semiconductor device layer;
   forming one or more first metal pillars on the first electrode interconnection layer on the first side of the semiconductor device layer;
   injecting a first insulating material so that the first insulating material is distributed around the one or more first metal pillars;
   removing the substrate; and
   forming a second electrode interconnection layer on a second side opposite to the first side of the semiconductor device layer;
   wherein the height of the first metal pillar is greater than 60 microns, greater than 80 microns, or greater than 100 microns.

19. The method according to claim 18, further comprising forming a third electrode interconnection layer on the first side of the semiconductor device layer, and forming one or more third metal pillars on the third electrode interconnection layer on the first side of the semiconductor device layer; wherein the third metal pillar may be formed simultaneously with the first metal pillar; wherein the step of injecting the first insulating material further comprises distributing the first insulating material around the one or more third metal pillars.

* * * * *